US012635568B2

(12) United States Patent
Chung et al.

(10) Patent No.: US 12,635,568 B2
(45) Date of Patent: May 19, 2026

(54) SEMICONDUCTOR CHIP PACKAGE WITH THROUGH ELECTRODE CONFIGURATION UNDER RECESSED CONNECTION PAD

(71) Applicant: SAMSUNG ELECTRONICS CO., LTD., Suwon-si (KR)

(72) Inventors: Hyunsoo Chung, Hwaseong-si (KR); Younglyong Kim, Anyang-si (KR); Sangcheon Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 790 days.

(21) Appl. No.: 17/899,025

(22) Filed: Aug. 30, 2022

(65) Prior Publication Data

US 2023/0154910 A1      May 18, 2023

(30) Foreign Application Priority Data

Nov. 17, 2021      (KR) ......................... 10-2021-0158616

(51) Int. Cl.
H10W 90/00          (2026.01)
H10W 20/20          (2026.01)
(Continued)

(52) U.S. Cl.
CPC ........... H10W 90/00 (2026.01); H10W 20/20 (2026.01); H10W 72/252 (2026.01);
(Continued)

(58) Field of Classification Search
CPC ..................... H01L 2224/05099–05499; H01L 2224/04042; H01L 2224/02125;
(Continued)

(56) References Cited

U.S. PATENT DOCUMENTS 8,202,797 B2      6/2012   Chi et al.
8,535,977 B2      9/2013   Abe
(Continued)

FOREIGN PATENT DOCUMENTS

KR      10 2014 0041970 A      4/2014
KR      10 2021 0053537 A      5/2021

OTHER PUBLICATIONS

Communication dated Aug. 22, 2025 issued by the Korean Intellectual Property Office in Korean Patent Application No. 10-2021-0158616.

*Primary Examiner* — Wael M Fahmy
*Assistant Examiner* — Thomas Wilson Mccoy
(74) *Attorney, Agent, or Firm* — Sughrue Mion, PLLC

(57)          ABSTRACT

A semiconductor package includes a first semiconductor chip including a first substrate having a front surface and a rear surface, a first insulating layer on the rear surface, a recess portion extending into the first substrate through the first insulating layer, a protective insulating layer extending along an inner side surface and a bottom surface of the recess portion, a through electrode extending from the front surface through the bottom surface of the recess portion and the protective insulating layer, and a first connection pad contacting the through electrode in the recess portion, and surrounded by the protective insulating layer, the first semiconductor chip having a flat upper surface defined by upper surfaces of the first insulating layer, the protective insulating layer, the first connection pad; and a second semiconductor chip disposed on the upper surface of the first semiconductor chip.

20 Claims, 20 Drawing Sheets

10Aa

(51) Int. Cl.
    H10W 72/20     (2026.01)
    H10W 72/90     (2026.01)

(52) U.S. Cl.
    CPC ........ *H10W 72/951* (2026.01); *H10W 72/952*
        (2026.01); *H10W 72/953* (2026.01); *H10W*
        *90/792* (2026.01)

(58) Field of Classification Search
    CPC . H01L 2224/08111; H01L 2224/08112; H01L
        2224/08145–08148; H01L 24/13; H01L
        24/02–09; H01L 23/49827; H01L
        23/5384; H01L 23/481; H01L
        2225/06541–06544; H01L 2225/06548;
        H01L 21/76898; H01L 21/486; H01L
        21/76829–76834; H10D 84/0149; H10D
        84/038; H10D 84/0186; H10W 20/068;
        H10W 20/069; H10W 20/082; H10W
        20/083; H10W 20/089; H10W 20/056;
        H10W 20/42; H10W 20/435; H10W
        20/427; H10W 20/43; H10W 20/20;
        H10W 70/60; H10W 70/611; H10W
        70/635; H10W 70/65; H10W 70/09;
        H10W 70/095; H10W 72/983; H10W
        72/59; H10W 72/9415; H10W 72/90;
        H10W 72/019; H10W 72/20; H10W
        80/743; H10W 90/792; H10W 90/294;
        H10W 90/823; H10W 20/023
    See application file for complete search history.

(56)            References Cited

U.S. PATENT DOCUMENTS

| | | | |
|---|---|---|---|
| 8,592,991 B2 | 11/2013 | Lee et al. | |
| 2013/0119543 A1 | 5/2013 | Yu et al. | |
| 2014/0084375 A1 | 3/2014 | Lee et al. | |
| 2014/0353837 A1* | 12/2014 | Watanabe | H01L 21/76841 |
| | | | 257/773 |
| 2016/0351473 A1* | 12/2016 | Uchida | H01L 24/03 |
| 2017/0053902 A1 | 2/2017 | Yu et al. | |
| 2017/0256476 A1* | 9/2017 | Kim | H01L 23/481 |
| 2017/0352634 A1 | 12/2017 | Chen et al. | |
| 2019/0385966 A1 | 12/2019 | Gao et al. | |
| 2020/0043783 A1 | 2/2020 | Kao et al. | |
| 2020/0066640 A1 | 2/2020 | Sarkar et al. | |
| 2020/0075498 A1* | 3/2020 | Kume | H01L 21/31144 |
| 2020/0135699 A1* | 4/2020 | Hwang | H01L 25/18 |
| 2020/0411482 A1 | 12/2020 | Gandhi et al. | |
| 2021/0125861 A1* | 4/2021 | Hopkins | H10B 43/50 |
| 2021/0134705 A1 | 5/2021 | Ma | |

* cited by examiner

10Aa

SEMICONDUCTOR CHIP PACKAGE WITH THROUGH ELECTRODE CONFIGURATION UNDER RECESSED CONNECTION PAD

CROSS-REFERENCE TO RELATED APPLICATION

This application is based on and claims priority under 35 U.S.C. § 119 to Korean Patent Application No. 10-2021-0158616, filed on Nov. 17, 2021, with the Korean Intellectual Property Office, the disclosure of which is incorporated by reference herein in its entirety.

BACKGROUND

1. Field

The disclosure relates to a semiconductor chip, a semiconductor package, and a method of manufacturing the same.

2. Description of Related Art

As demand for high capacity, thinness, and miniaturization of electronic products increases, various types of semiconductor packages are being developed. Recently, as a method to integrate more components (e.g., semiconductor chips) into a package structure, a direct bonding technology for bonding semiconductor chips without an adhesive film (e.g., non-conductive adhesive film (NCF)) or a connection bump (e.g., a solder ball) has been developed.

SUMMARY

An aspect of the disclosure is to provide a semiconductor chip having a simplified process and improved yield, and a method of manufacturing the same.

An aspect of the disclosure is to provide a semiconductor package having improved reliability.

In accordance with an aspect of the disclosure, a semiconductor package includes a first semiconductor chip including a first substrate including a front surface and a rear surface facing each other; a first insulating layer disposed on the rear surface of the first substrate; a recess portion extending into the first substrate through the first insulating layer; a protective insulating layer extending along an inner side surface of the recess portion and a bottom surface of the recess portion; a through electrode extending from the front surface to penetrate through the bottom surface of the recess portion and the protective insulating layer; and a first connection pad contacting the through electrode in the recess portion, the first connection pad being surrounded by the protective insulating layer, the first semiconductor chip including a flat upper surface defined by each of an upper surface of the first insulating layer, an upper surface of the protective insulating layer, and an upper surface of the first connection pad; and a second semiconductor chip disposed on the upper surface of the first semiconductor chip, the second semiconductor chip including a second substrate; a second insulating layer disposed below the second substrate and contacting the upper surface of the first insulating layer; and a second connection pad disposed in the second insulating layer and contacting the upper surface of the first connection pad.

In accordance with an aspect of the disclosure, a semiconductor package includes a first semiconductor chip including a first substrate; a first insulating layer disposed on an upper surface of the first substrate; a recess portion extending into the first substrate through the first insulating layer; a protective insulating layer covering an inner side surface of the recess portion and a bottom surface of the recess portion; a through electrode protruding farther than the bottom surface of the recess portion through at least a portion of the first substrate; and a first connection pad disposed in the recess portion, the first connection pad being surrounded by the protective insulating layer; and a second semiconductor chip disposed on the first semiconductor chip, the second semiconductor chip including a second insulating layer contacting the first insulating layer, and a second connection pad disposed in the second insulating layer and contacting the first connection pad, wherein a thickness of the first insulating layer in a direction perpendicular to the upper surface of the first substrate is greater than a thickness of the protective insulating layer in a direction perpendicular to the inner side surface of the recess portion or the bottom surface of the recess portion.

In accordance with an aspect of the disclosure, a semiconductor package includes a first semiconductor chip including a first substrate; a first insulating layer disposed on the first substrate; a plurality of recess portions extending into the first substrate through the first insulating layer; a plurality of protective insulating layers, each of the plurality of protective insulating layers covering an inner side surface and a bottom surface of a respective one of the plurality of recess portions; and a first connection pad and a first dummy pad respectively disposed in the plurality of recess portions, the first connection pad and the first dummy pad being surrounded by a respective one of the plurality of protective insulating layers, the first semiconductor chip comprising an upper surface defined by an upper surface of the first insulating layer, an upper surface of each of the plurality of protective insulating layers, an upper surface of the first connection pad, and an upper surface of the first dummy pad; and a second semiconductor chip disposed on the first semiconductor chip, the second semiconductor chip including a second insulating layer contacting the first insulating layer; a second connection pad disposed in the second insulating layer and contacting the first connection pad; and a second dummy pad disposed in the second insulating layer and contacting the first dummy pad, wherein, on a plane parallel to the upper surface of the first semiconductor chip, a planar shape of the first dummy pad is different from a planar shape of the first connection pad.

In accordance with an aspect of the disclosure, a semiconductor chip includes a substrate including a front surface and a rear surface opposite to the front surface, the front surface including an active region; a circuit layer disposed on the front surface of the substrate, the circuit layer including an interconnection structure connected to the active region; an insulating layer disposed on the rear surface of the substrate; a recess portion extending into the substrate through the insulating layer, the recess portion comprising an inner side surface defined by the insulating layer and the substrate and a bottom surface defined by the substrate; a protective insulating layer extending along the inner side surface of the recess portion and the bottom surface of the recess portion; a through electrode extending from the front surface of the substrate to penetrate through the protective insulating layer; and a connection pad including a barrier layer contacting the protective insulating layer in the recess portion; and a plating layer surrounded by the barrier layer, the plating layer including a plurality of upper surfaces, wherein an upper surface of the insulating layer, an uppermost surface of the protective insulating layer, an uppermost surface of the barrier layer, and the plurality of upper surfaces of the plating layer are substantially coplanar.

In accordance with an aspect of the disclosure, a method of manufacturing a semiconductor chip includes preparing a preliminary semiconductor wafer including a plurality of through electrodes; polishing an upper surface of the preliminary semiconductor wafer to form a semiconductor wafer including a front surface and a rear surface opposite to the front surface, the front surface including an active region, a height between the rear surface and the front surface being greater than a height of the plurality of through electrodes; forming an insulating layer on the rear surface of the semiconductor wafer; etching a portion of the insulating layer and the semiconductor wafer, to form a plurality of recess portions extending into the semiconductor wafer through the insulating layer; forming a first preliminary protective insulating layer filling the plurality of recess portions; etching a portion of the first preliminary protective insulating layer to form a second preliminary protective insulating layer extending along an inner side surface of each of the plurality of recess portions and a bottom surface of each of the plurality of recess portions; forming a preliminary barrier layer and a preliminary plating layer in etched regions of the second preliminary protective insulating layer; and polishing the preliminary plating layer, the preliminary barrier layer, and the second preliminary protective insulating layer to form a plurality of plating layers, a plurality of barrier layers, and a plurality of protective insulating layers.

In accordance with an aspect of the disclosure, a semiconductor chip includes a substrate; and a plurality of through electrodes extending from a first surface of the substrate toward a second surface of the substrate opposite to the first surface without extending to the second surface, wherein a plurality of recess portions are formed in the second surface of the substrate such that, for each of the plurality of recess portions, an upper end of a respective one of the plurality of through electrodes protrudes from a bottom surface of the recess portion.

BRIEF DESCRIPTION OF DRAWINGS

The above and other aspects, features, and advantages of the disclosure will be more clearly understood from the following detailed description taken in conjunction with the accompanying drawings, in which.

DETAILED DESCRIPTION

Hereinafter, example embodiments of the will be described with reference to the accompanying drawings as follows.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1A:
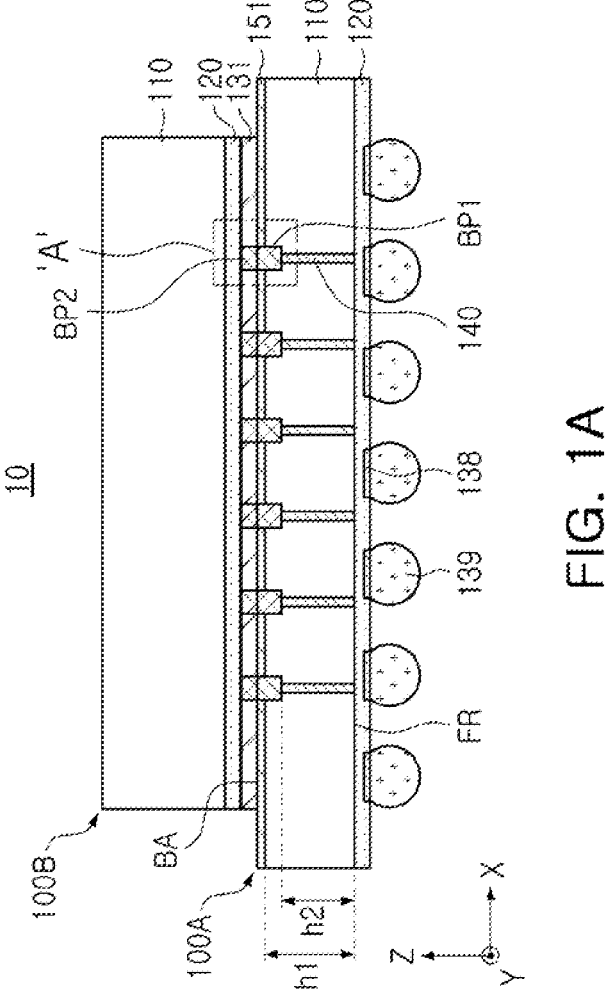
FIG. 1A is a cross-sectional view illustrating a semiconductor package according to an example embodiment.
Figure 1B:
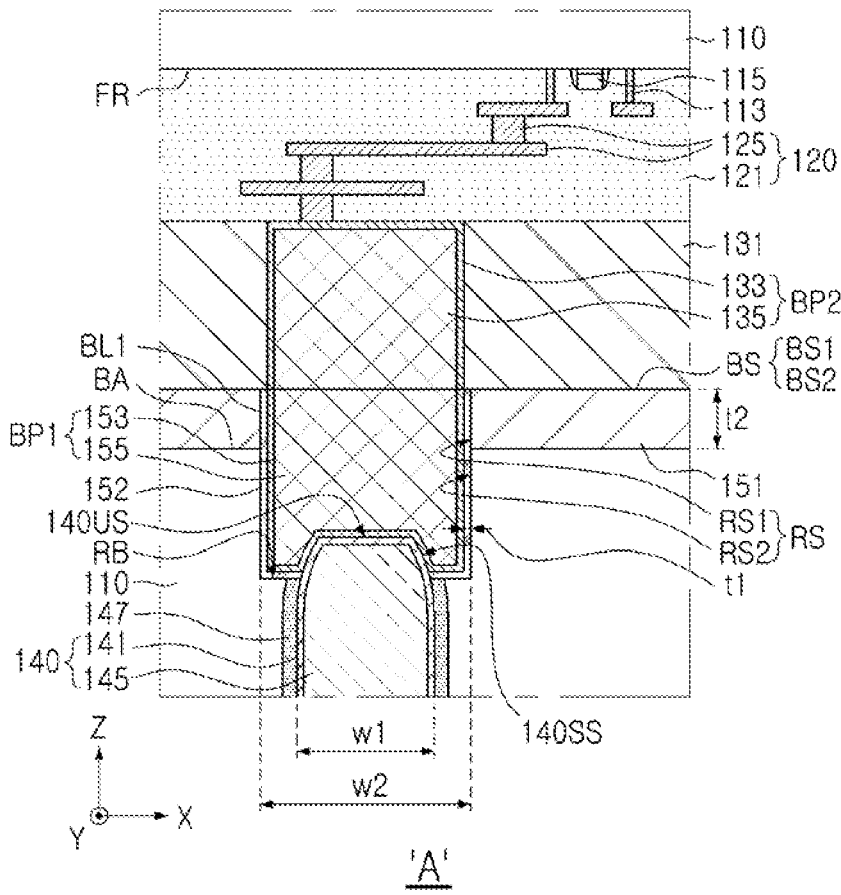
FIG. 1B is a partially enlarged view illustrating region 'A' of FIG. 1A.
Figure 2:
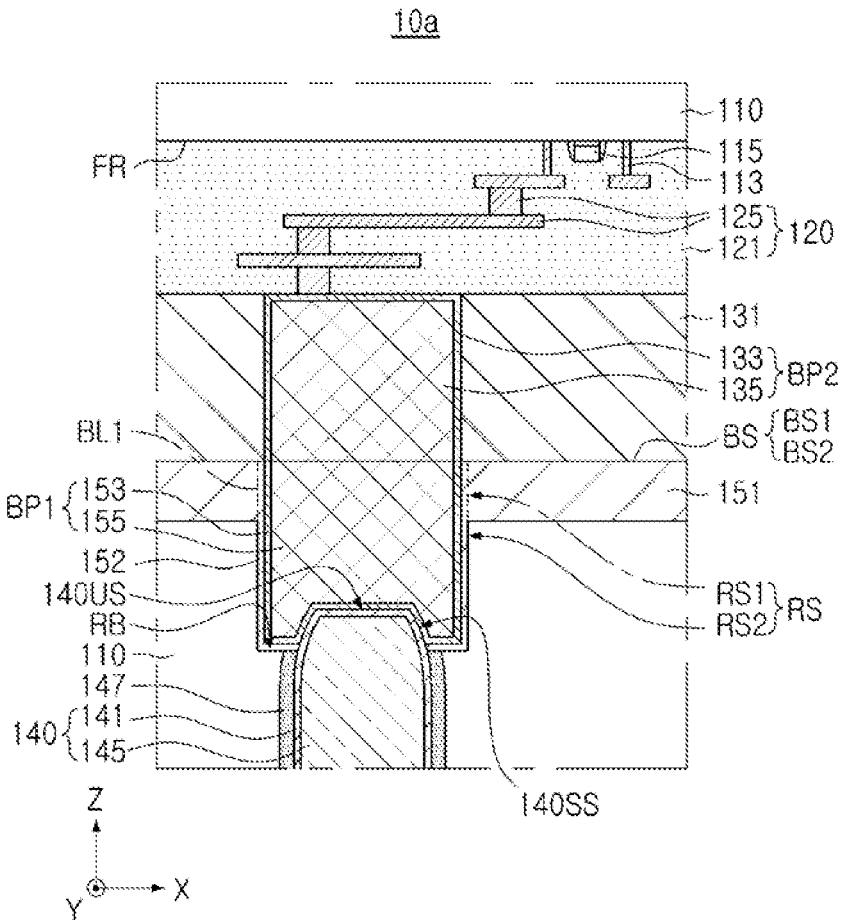
FIG. 2 is a partially enlarged view illustrating a modified example of region 'A' of FIG. 1A.
Figure 3:
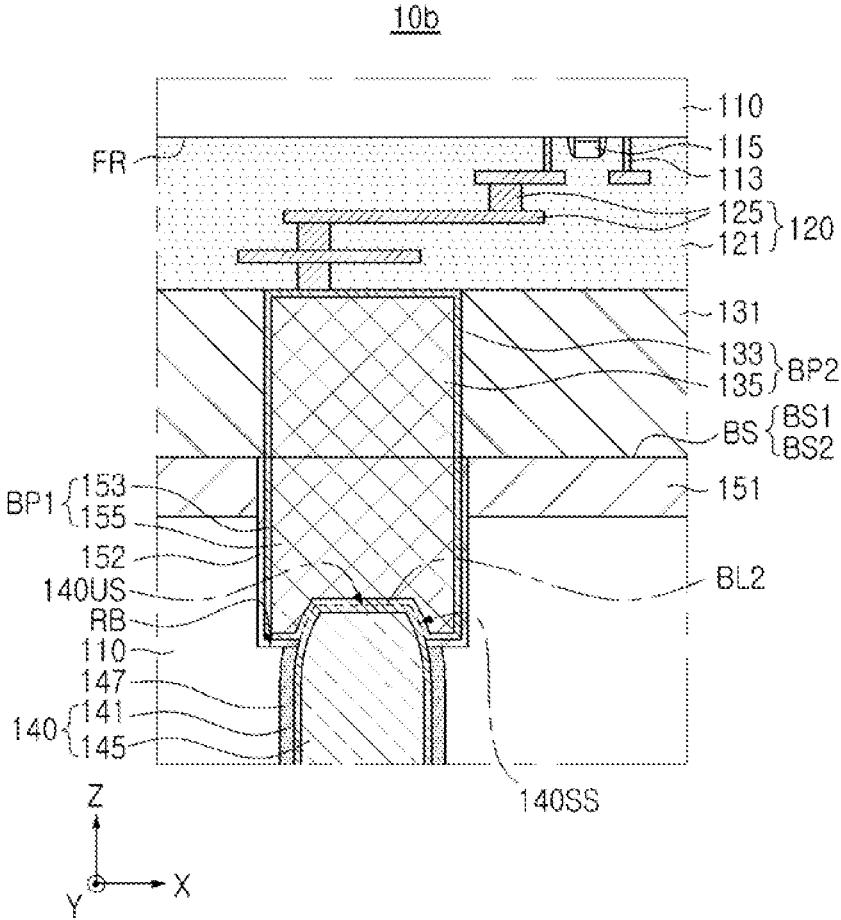
FIG. 3 is a partially enlarged view illustrating a modified example of region 'A' of FIG. 1A.

FIG. 1A is a cross-sectional view illustrating a semiconductor package 10 according to an example embodiment, and FIG. 1B is a partially enlarged view illustrating region 'A' of FIG. 1A. FIG. 2 is a partially enlarged view illustrating a modified example of region 'A' of FIG. 1A, and FIG. 3 is a partially enlarged view illustrating a modified example of region 'A' of FIG. 1.

Referring to FIGS. 1A and 1B, the semiconductor package 10 according to an example embodiment may include a plurality of semiconductor chips 100A and 100B stacked in a vertical direction (Z-axis direction). For example, the semiconductor package 10 according to an example embodiment may include a first semiconductor chip 100A having a first surface BS1 and a second semiconductor chip 100B having a second surface BS2, and the first surface BS1 and the second surface BS2 may be bonded and coupled to each other (for example, it may be referred to as hybrid bonding, direct bonding, or the like), to form a bonding surface BS. The bonding surface BS may be formed by metal bonding between the first bonding pad BP1 of the first semiconductor chip 100A and the second bonding pad BP2 of the second semiconductor chip 100B and dielectric bonding between the first insulating layer 151 of the first semiconductor chip 100A and the second insulating layer 131 of the second semiconductor chip 100B. Here, the first surface BS1 and the second surface BS2 may be referred to as an "upper surface BS1" of the first semiconductor chip 100A and a "lower surface BS2" of the second semiconductor chip 100B, respectively, based on the drawings. In addition, the first bonding pad BP1 and the second bonding pad BP2 may be referred to as a first connection pad BP1 and a second connection pad BP2, respectively. Meanwhile, in FIG. 1A, it is illustrated that a width of the first semiconductor chip 100A in a horizontal direction (for example, X-axis direction) is greater than a width of the second semiconductor chip 100B, but according to an example embodiment, the width of the first semiconductor chip 100A in a horizontal direction (e.g, X-axis direction) may be substantially equal to or smaller than the width of the second semiconductor chip 100B.

In the disclosure, a first connection pad BP1 connected to the through electrode 140 through the first insulating layer 151 and a protective insulating layer 152 surrounding the first connection pad BP1 may be formed on the rear surface BA of the first substrate 110, such that a first semiconductor chip 100A having a reduced thickness and a simplified manufacturing process may be provided. In addition, by directly bonding a second semiconductor chip 100B on an upper surface BS1 of the first connection pad BP1 provided by the first connection pad BP1, the protective insulating layer 152, and the first insulating layer 151, a semiconductor package 10 having improved bonding reliability of the bonding surface BS and improved connection reliability of the first connection pad BP1 and the second connection pad BP2 may be provided.

Hereinafter, components of the first semiconductor chip 100A and the second semiconductor chip 100B forming the bonding surface BS will be described in detail.

The first semiconductor chip 100A may include a first substrate 110, a first circuit layer 120, a first insulating layer 151, a protective insulating layer 152, a through electrode 140, and a first connection pad BP1. The first semiconductor chip 100A may have a flat upper surface BS1 provided by an upper surface of the first insulating layer 151, an upper surface of the protective insulating layer 152, and an upper surface of the first connection pad BP1. For example, an upper surface of the first insulating layer 151, an uppermost surface of the protective insulating layer 152, and upper surfaces of the first connection pad BP1, exposed to the upper surface BS1 of the first semiconductor chip 100A, may be substantially coplanar to form the flat upper surface BS1. For example, the upper surface BS1 of the first semiconductor chip 100A may include the upper surface of the first insulating layer 151, the upper surface of the protective insulating layer 152, and the upper surface of the first connection pad BP1. Here, the upper surface of the first connection pad BP1 may include an uppermost surface of the barrier layer 153 and an upper surface of the plating layer 155.

The first substrate 110 may be a semiconductor wafer substrate having a front surface FR and a rear surface BA opposite to each other. For example, the first substrate 110 may be a semiconductor wafer including a semiconductor element such as silicon or germanium, or a compound semiconductor such as silicon carbide (SiC), gallium arsenide (GaAs), indium arsenide (InAs), and indium phosphide (InP). The front surface FR may be an active surface having an active region doped with impurities, and the rear surface BA may be an inactive surface positioned opposite to the front surface FR.

The first circuit layer 120 may be disposed on the front surface FR of the first substrate 110, and may include an interconnection structure 125 connected to the active region and an interlayer insulting layer 121 surrounding the same. The interlayer insulating layer 121 may include Flowable Oxide (FOX), Tonen SilaZen (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable Chemical Vapor Deposition CVD (FCVD) oxide, or a combination thereof. At least a portion of the interlayer insulating layer 121 surrounding the interconnection structure 125 may be configured as a low-k layer. The interlayer insulating layer 121 may be formed using a chemical vapor deposition (CVD) process, a flowable-CVD process, or a spin coating process. The interconnection structure 125 may be formed in a multilayer structure including interconnection patterns and vias, formed of, for example, aluminum (Al), gold (Au), cobalt (Co), copper (Cu), nickel (Ni), lead (Pb), tantalum (Ta), tellurium (Te), titanium (Ti), tungsten (W), or a combination thereof. A barrier film including titanium (Ti), titanium nitride (TiN), tantalum (Ta), or tantalum nitride (TaN) may be disposed between the interconnection pattern and/or via and the interlayer insulating layer 121. Individual elements 115 constituting an integrated circuit may be disposed on the front surface FR of the first substrate 110. In this case, the interconnection structure 125 may be electrically connected to individual elements 115 by an interconnection portion 113 (e.g., contact plug). The individual elements 115 may include FETs such as planar FETs or FinFETs, memory devices such as a flash memory, DRAM, SRAM, EEPROM, PRAM, MRAM, FeRAM, and RRAM, logic devices such as AND, OR, NOT, and various active devices and/or passive devices such as system LSI, CIS, and MEMS. A connection terminal 138 and a connection bump 139 may be disposed below the first circuit layer 120. The connection terminal 138 may be a pad structure electrically connected to the interconnection structure 125. The connection bump 139 may be, for example, a conductive bump structure such as a solder ball or a copper (Cu) post.

The first insulating layer 151 may be disposed on the rear surface BA of the first substrate 110. The first insulating layer 151 may include an insulating material capable of being bonded and coupled to the second insulating layer 131 below the second semiconductor chip 100B. For example, the first insulating layer 151 may include silicon oxide (SiO) or silicon carbonitride (SiCN). That is, at least a portion of the upper surface of the first insulating layer 151 may form a bonding surface BS with the second insulating layer 131. Here, the first insulating layer 151 may be referred to as a "rear" insulating layer 151 disposed on the rear surface BA of the substrate 110, and the second insulating layer 131 may be referred to as a "front" insulating layer 131 disposed on the front surface FR of the substrate 110.

The protective insulating layer 152 may be formed in a recess portion extending into the first substrate 110 through the first insulating layer 151 from the rear surface BA of the substrate 110. The recess portion may have an inner side surface RS including a first region RS1 provided by the first insulating layer 151 and a second region RS2 provided by the first substrate 110, and a bottom surface RB provided by the first substrate 110. The recess portion may be formed to expose at least a portion of the through electrode 140. Accordingly, a width w2 of the recess portion in a horizontal direction (e.g, in an X-axis direction) may be greater than a width w1 of the through electrode 140. The width w2 of the recess portion may be variously modified according to a design of the first connection pad BP1. The width w1 of the through electrode 140 may be modified according to a design (e.g., an aspect ratio) of the through electrode 140, which will be described later along with the aspect ratio of the through electrode 140. The protective insulating layer 152 may be formed to cover the inner side surface RS and the bottom surface RB of the recess portion. For example, the insulating protective layer 152 may have a shape conformally extending along the inner side surface RS and the bottom surface RB of the recess portion. Since an uppermost surface of the insulating protective layer 152 provides a portion of the bonding surface BS, the protective insulating layer 152 may include an insulating material that can be bonded and coupled to the second insulating layer 131, for example, silicon oxide (SiO) or silicon carbonitride (SiCN). For example, the insulating protective layer 152 may include an HDP oxide layer.

In addition, the protective insulating layer 152 may be formed to surround at least a portion of a side surface and a lower surface of the first connection pad BP1 to electrically insulate the first connection pad BP1 from the first substrate 110. A thickness t1 of the protective insulating layer 152 may be in a range of about 10 nm or more, for example, about 10 nm to about 100 nm, about 10 nm to about 80 nm, or about 10 nm to about 50 nm. When the thickness t1 of the protective insulating layer 152 is less than about 10 nm, it may be difficult to perform an insulating function between the first connection pad BP1 and the first substrate 110. For example, the thickness t2 of the first insulating layer 151 in a direction perpendicular to the rear surface BA (Z-axis direction) may be greater than the thickness t1 of the protective insulating layer 152 in a direction perpendicular to the inner side surface RS or the bottom surface RB of the recess portion (Z-axis or X-axis direction). The thickness t2 of the first insulating layer 151 may be in a range of about 100 nm or more, for example, about 100 nm to about 1000 nm, about 100 nm to about 500 nm, or about 100 nm to about 250 nm. When the thickness t2 of the first insulating layer 151 is less than about 100 nm, bonding stability of the first insulating layer 151 may be deteriorated. For example, the protective insulating layer 152 covering the first region RS1 of the recess portion may be distinguished by a first boundary line BL1 between the first insulating layer 151 and the protective insulating layer 152. In other words, the first insulating layer 151 and the protective insulating layer 152 may be separate from each other at the first boundary line BL1 in the first region RS1. However, depending on the embodiment, a boundary between the first insulating layer 151 and the protective insulating layer 152 may not be clearly distinguished.

For example, as illustrated in FIG. 2, in the semiconductor package 10a of the modified example, a first boundary line BL1 between the first insulating layer 151 and the protective insulating layer 152 may not be clearly distinguished. For example, when the first insulating layer 151 and the protective insulating layer 152 include the same type of insulating material, the first boundary line BL1 may be unclear.

The through electrode 140 may be formed to penetrate through at least a portion of the first substrate 110 and protrude farther toward the rear surface BA of the substrate 110 than the bottom surface RB of the recess portion. For example, the through electrode 140 may extend from the front surface FR of the first substrate 110 to penetrate the bottom surface RB of the recess portion and the protective insulating layer 152. Accordingly, the through electrode 140 may have upper surfaces 140US and side surfaces 140SS respectively exposed from the protective insulating layer 152. The upper surface 140US and the side surface 140SS of the through electrode 140 may be in direct contact with the first connection pad BP1 (or a barrier layer 153) in the recess portion. The through electrode 140 may include a via plug 145 and a barrier layer 141 surrounding a side surface of the via plug 145. The via plug 145 may include, for example, tungsten (W), titanium (Ti), aluminum (Al), or copper (Cu), and may be formed by a plating process, a physical vapor deposition (PVD) process, or a CVD process. The side barrier layer 141 may include titanium (Ti), titanium nitride (TiN), tantalum (Ta), or tantalum nitride (TaN), and may be formed by a PVD process or a CVD process.

In addition, a side insulating film 147 extending from the front surface FR of the first substrate 110 along a side surface of the through electrode 140 that is not exposed from the protective insulating layer 152 may be formed around the through electrode 140. For example, at least a portion of the bottom surface RB of the recess portion may be provided by (e.g., defined by) an upper surface of the side insulating film 147. The side insulating film 147 may electrically separate the via plug 145 from the second substrate 110. The side insulating film 147 may include an insulating material such as silicon oxide, silicon nitride, or silicon oX-Ynitride (e.g, high aspect ratio process (HARP) oxide), and may be formed by a PVD process or a CVD process.

According to the disclosure, a recess portion extending into the first substrate 110 to expose the through electrode 140 may be formed, and the first connection pad BP1 connected to the through electrode 140 may be formed in the recess portion, thereby reducing an aspect ratio of the through electrode 140. In addition, since a polishing process (e.g., chemical mechanical polishing (CMP)) for exposing the through electrode 140 is omitted, defects occurring in the polishing process may be prevented and process difficulty may be reduced. Accordingly, in example embodiments of the disclosure, a height h2 of the through electrode 140 may be less than a height h1 of the first substrate 110. For example, the through electrode 140 may have an aspect ratio of 10 or less or 5 or less. The height h2 of the through electrode 140 may be in a range of about 30 μm to about 50 μm, or about 30 μm to about 40 μm, and a width w1 of the through electrode 140 in a horizontal direction (e.g., X-axis direction) may be in a range of about 2 μm to about 10 μm.

The first connection pad BP1 may be disposed in the recess portion so as to be in contact with the through electrode 140 in a portion other than a portion surrounded by the protective insulating layer 152. The first connection pad BP1 may include a first barrier layer 153 in contact with the protective insulating layer 152 and the through electrode 140 in the recess portion and a first plating layer 155 surrounded by the first barrier layer 153. The first plating layer 155 may be disposed on the first barrier layer 153 and fill an inside of the recess portion, and the first barrier layer 153 may be formed to surround an outer edge of the first plating layer 155 along the protective insulating layer 152. Accordingly, an upper surface of the first plating layer 155 and an uppermost surface of the first barrier layer 153 may provide an upper surface of the first connection pad BP1. The first plating layer 155 and the first barrier layer 153 may include a conductive material. For example, the first plating layer 155 may include at least one of copper (Cu), nickel (Ni), gold (Au), and silver (Ag), and the first barrier layer 153 may include at least one of titanium (Ti), titanium nitride (TiN), tantalum (Ta), and tantalum nitride (TaN). In addition, the first barrier layer 153 may be in contact with upper surfaces 140US and side surfaces 140SS of the through electrode 140 exposed from the protective insulating layer 152. Accordingly, the first barrier layer 153 (hereinafter referred to as "upper barrier layer") and the barrier layer 141 (hereinafter referred to as "lower barrier layer") of the through electrode 140 may be distinguished by a second boundary line BL2 therebetween. However, depending on the embodiment, the first barrier layer 153 (or referred to as "upper barrier layer") and the barrier layer 141 (or referred to as "lower barrier layer") may not be clearly distinguished.

For example, as illustrated in FIG. 3, in a semiconductor package 10*b* of the modified example, the second boundary line BL2 between the upper barrier layer 153 surrounding an outer edge of the plating layer 155 of the first connection pad BP1 and the lower barrier layer 141 surrounding an outer edge of the via plug 145 of the through electrode 140 may not be clearly distinguished.

With reference, for example, to FIGS. 1A and 1B, the second semiconductor chip 100B is disposed on the upper surface BS1 of the first semiconductor chip 100A, and may include a second substrate 110, a second circuit layer 120, a second insulating layer 131, and a second connection pad BP2. Since the first semiconductor chip 100A and the second semiconductor chip 100B may have substantially the same or similar structures, the same or similar components are denoted by the same or similar reference numerals, and hereinafter, repeated descriptions of the same components are omitted. For example, although the substrate 110 of each of the first semiconductor chip 100A and the second semiconductor chip 100B is referred to as a first substrate 110 and a second substrate 110, it may be understood that the first substrate 110 and the second substrate 110 have substantially the same characteristics.

The second semiconductor chip 100B may have a flat lower surface BS2 provided by a lower surface of the second insulating layer 131 and a lower surface of the second connection pad BP2, wherein the lower surface BS2 may be in contact with the upper surface BS1 of the first semiconductor chip 100A to form a bonding surface BS. The second insulating layer 131 may be disposed below the second substrate 110 and may be in contact with an upper surface of the first insulating layer 151. The second insulating layer 131 may include an insulating material, capable of being bonded and coupled to the first insulating layer 151, for example, silicon oxide (SiO) or silicon carbonitride (SiCN). According to an example embodiment, the semiconductor chip may include both the first insulating layer 151 and the second insulating layer 131 (refer to FIG. 7A), and in this case, in order to distinguish the first insulating layer 151 and the second insulating layer 131, the first insulating layer 151 may be referred to as a "rear" insulating layer 151, and the second insulating layer 131 may be referred to as a "front" insulating layer 131. Also, either of the first insulating layer 151 or the second insulating layer 131 may be referred to as an "insulating layer" in any case in which it is clear which element is being described.

The second connection pad BP2 may be disposed in the second insulating layer 131 and may be in contact with an upper surface of the first connection pad BP1. The second connection pad BP2 may include a second plating layer 135 and a second barrier layer 133 surrounding an outer edge of the second plating layer 135, and a lower surface of the second connection pad BP2 may be provided by a lower surface of the second plating layer 135 and a lower surface of the second barrier layer 133. In other words, the lower surface of the second connection pad BP2 may include the lower surface of the second plating layer 135 and the lower surface of the second barrier layer 133.

The first semiconductor chip 100A and the second semiconductor chip 100B may be chiplets constituting a multi-chip module (MCM). In this case, the number of the second semiconductor chips 100B stacked vertically or horizontally on the first semiconductor chip 100A may be two or more. The first semiconductor chip 100A may be a logic chip including a central processor (CPU), a graphics processor (GPU), a field programmable gate array (FPGA), an application processor (AP), a digital signal processor (DSP), an encryption processor, a microprocessor, a microcontroller, an analog-digital converter, an application-specific IC (ASIC), or the like, and the second semiconductor chip 100B may be a memory chip such as DRAM, SRAM, PRAM, MRAM, FeRAM, or RRAM.

Figure 4A:
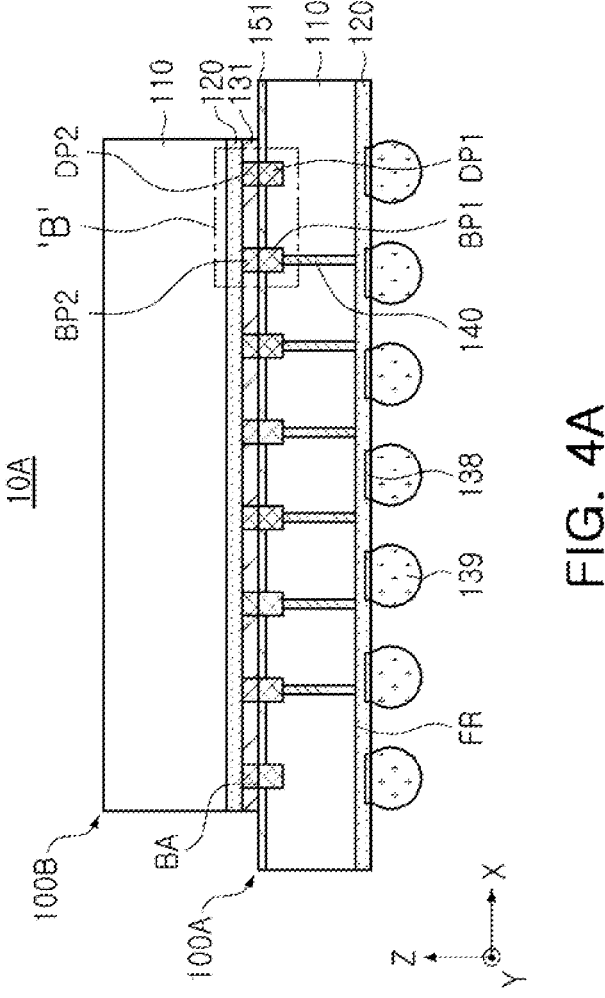
FIG. 4A is a cross-sectional view illustrating a semiconductor package according to an example embodiment.
Figure 4B:
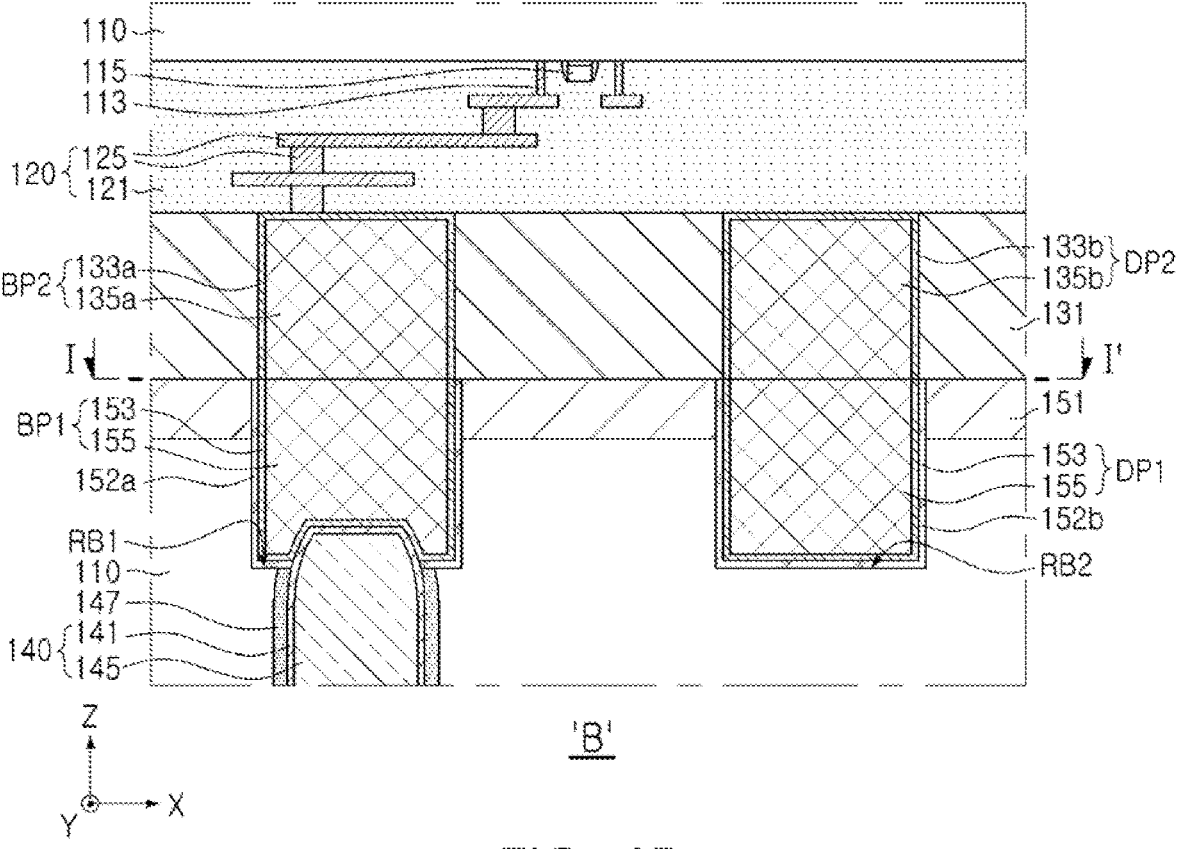
FIG. 4B is a partially enlarged view illustrating region 'B' of FIG. 4A.
Figure 4C:
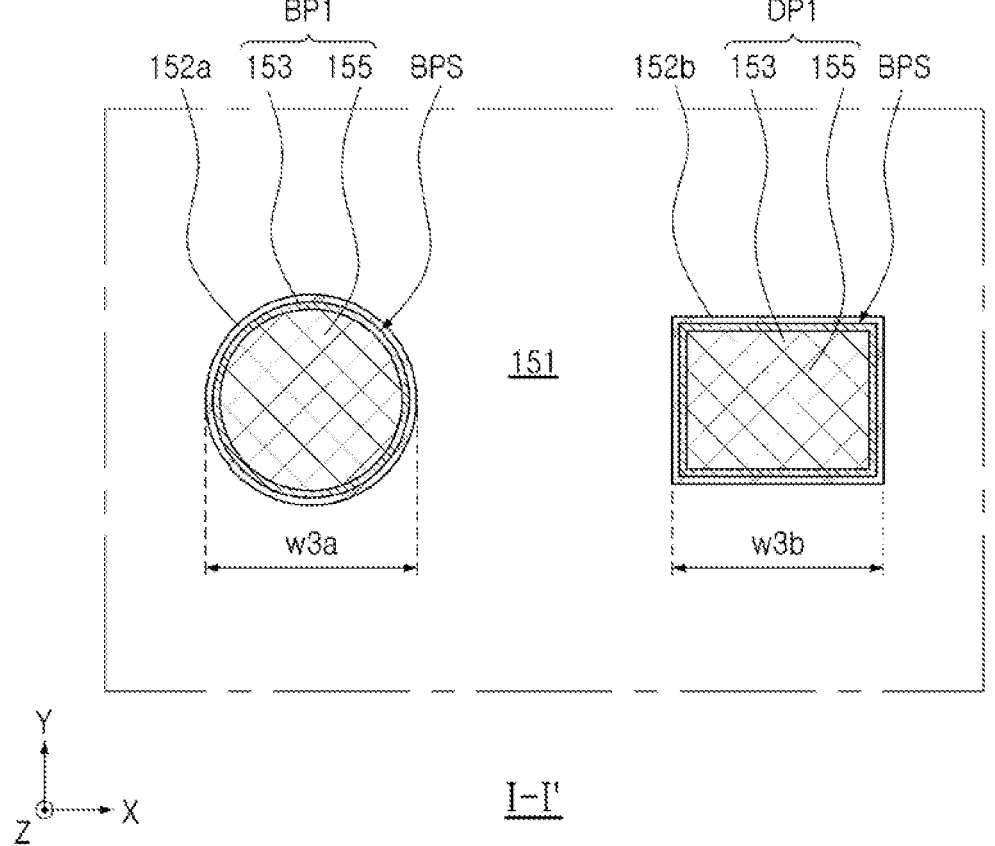
FIG. 4C is a cross-sectional view illustrating a cross-section taken along line I-I' in FIG. 4B.
Figure 5:
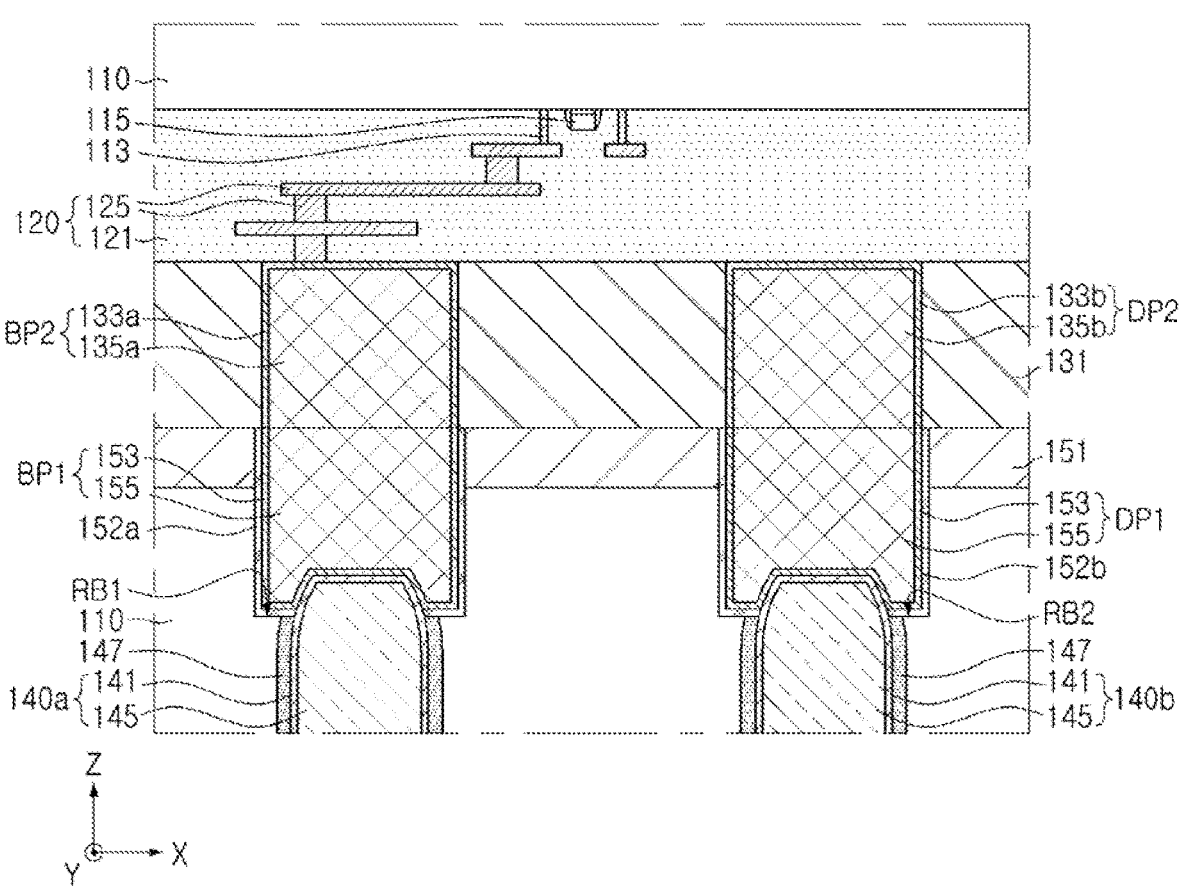
FIG. 5 is a partially enlarged view illustrating a modified example of region 'B' of FIG. 4A.

FIG. 4A is a cross-sectional view illustrating a semiconductor package 10A according to an example embodiment of the disclosure, FIG. 4B is a partially enlarged view illustrating region 'B' of FIG. 4A, and FIG. 4C is a plan view illustrating a cross-section taken along line I-I' in FIG. 4B. FIG. 5 is a partially enlarged view illustrating a modified example of region 'B' of FIG. 4A.

Referring to FIGS. 4A and 4B, the semiconductor package 10A according to an example embodiment may have the same or similar characteristics as those described with reference to FIGS. 1A to 3, except for further including a first dummy pad DP1 electrically insulated from a first connection pad BP1. For example, the first semiconductor chip 100A of an example embodiment may include a plurality of recess portions extending into the first substrate 110 through the first insulating layer 151, protective insulating layers 152*a* and 152*b* covering bottom surfaces RB1 and RB2 of each of the plurality of recess portions, and at least one first connection pad BP1 and at least one first dummy pad DP1 respectively disposed in the plurality of recess portions and surrounded by the protective insulating layers 152*a* and 152*b*. In this case, an upper surface of the first semiconductor chip 100A may be provided by (e.g., may include) an upper surface of the first insulating layer 151, upper surfaces of the protective insulating layers 152*a* and 152*b*, an upper surface of the first connection pad BP1, and an upper surface of the first dummy pad DP1. The first connection pad BP1 and the first dummy pad DP1 may each include a respective plating layer 155 and a respective barrier layer 153.

The first dummy pad DP1 may be electrically insulated from the through electrode 140 and the first connection pad BP1, and may be arranged in a region in which the first connection pad BP1 is not disposed such that heat dissipation characteristics of the first semiconductor chip 100A may be improved. According to example embodiments, the first dummy pad DP1 may be connected to a dummy through electrode.

For example, as illustrated in FIG. 5, a semiconductor package 10Aa of a modified example may include a plurality of through electrodes 140*a* and 140*b* protruding farther than a first bottom surface RB1 and a second bottom surface RB2 of each of the plurality of recess portions. At least a portion of the first through electrode 140*a* among the plurality of through electrodes may be connected to a first connection pad BP1, and a portion of the second through electrode 140*b* may be connected to a first dummy pad DP1.

In addition, according to an example embodiment, in the manufacturing process of the first semiconductor chip 100A, a second recess portion (e.g., 'Rb' in FIG. 6D) in which the first dummy pad DP1 is disposed may be used as an alignment mark for etching a second preliminary protective insulating layer (e.g., '152p2 in FIG. 6F), and in this case, a patterning process for forming an alignment mark may be omitted, thereby further simplifying the manufacturing process. Accordingly, the first dummy pad DP1 in the second recess portion (e.g., 'Rb' in FIG. 6D) may have a different planar shape than that of the first connection pad BP1.

For example, as illustrated in FIG. 4C, on a plane (X-Y plane), parallel to an upper surface of the first semiconductor chip 100A, a planar shape of the first connection pad BP1 may be circular, and a planar shape of the first dummy pad may be rectangular. A side surface BPS of the first connection pad BP1 may be surrounded by the first protective insulating layer 152a, and a side surface DPS of the first dummy pad DP1 may be surrounded by the second protective insulating layer 152b. This does not mean that the planar area of the first dummy pad DP1 must be greater or smaller than that of the first connection pad BP1, which can be understood as only the shape of the first dummy pad DP1 and the first connection pad BP1 being patterned differently with the same process. For example, a width w3a of the first connection pad BP1 in one direction (e.g., an X-axis direction) may be substantially the same as a width w3b of the first dummy pad DP1. In addition, the planar shapes of the first connection pad BP1 and the first dummy pad are not limited to the shapes illustrated in the drawings, and may be variously modified, such as a circle, an ellipse, a square, a trapezoid, a cross, and the like.

According to example embodiments, the second semiconductor chip 100B may further include a second dummy pad DP2 disposed in the second insulating layer 131 and in contact with the first dummy pad DP1. The second dummy pad DP2 may have a structure substantially the same as or similar to that of the first dummy pad DP1. For example, on a plane, the second dummy pad DP2 may have a planar shape corresponding to the planar shape of the first dummy pad DP1.

FIGS. 6A to 6H are cross-sectional views for each main process for explaining a method of manufacturing a semiconductor chip according to an example embodiment. Hereinafter, "upper surface," "lower surface," "upper," "lower," etc. are referred to based on the direction illustrated in each drawing.

Figure 6A:
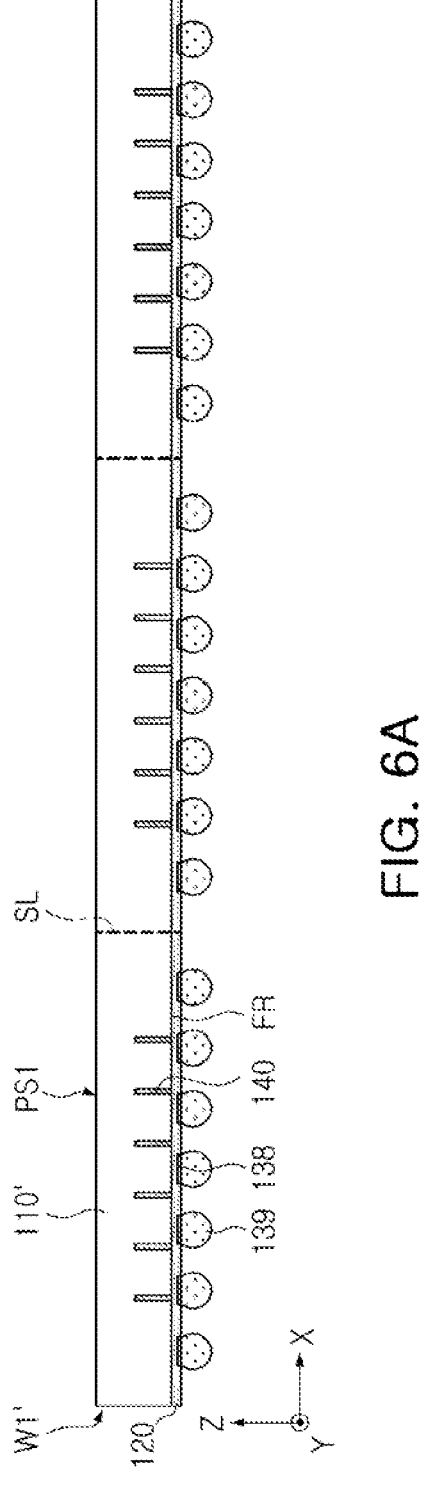
FIGS. 6A to 6H are cross-sectional views for each main process for illustrating a method of manufacturing a semiconductor chip according to an example embodiment.

Referring to FIG. 6A, first, a preliminary semiconductor wafer W1' may be prepared.

The preliminary semiconductor wafer W1' may be in a state in which a circuit layer 120 for a plurality of semiconductor chips, a connection terminal 138, and a connection bump 139 are formed below a front surface FR of the preliminary substrate 110'. The preliminary semiconductor wafer W1' may include a plurality of through electrodes 140 disposed in semiconductor chip regions separated by a scribe line SL. A carrier substrate for supporting and handling the preliminary semiconductor wafer W1' may be disposed below the preliminary semiconductor wafer W1' when subsequent processes are performed. The preliminary semiconductor wafer W1' may have an upper surface PS1 covering upper surfaces of the plurality of through electrodes 140. The upper surface PS1 of the preliminary semiconductor wafer W1' may be spaced apart from upper surfaces of the through electrodes 140 such that the through electrodes 140 do not extend all the way through the preliminary substrate 110'.

Figure 6B:
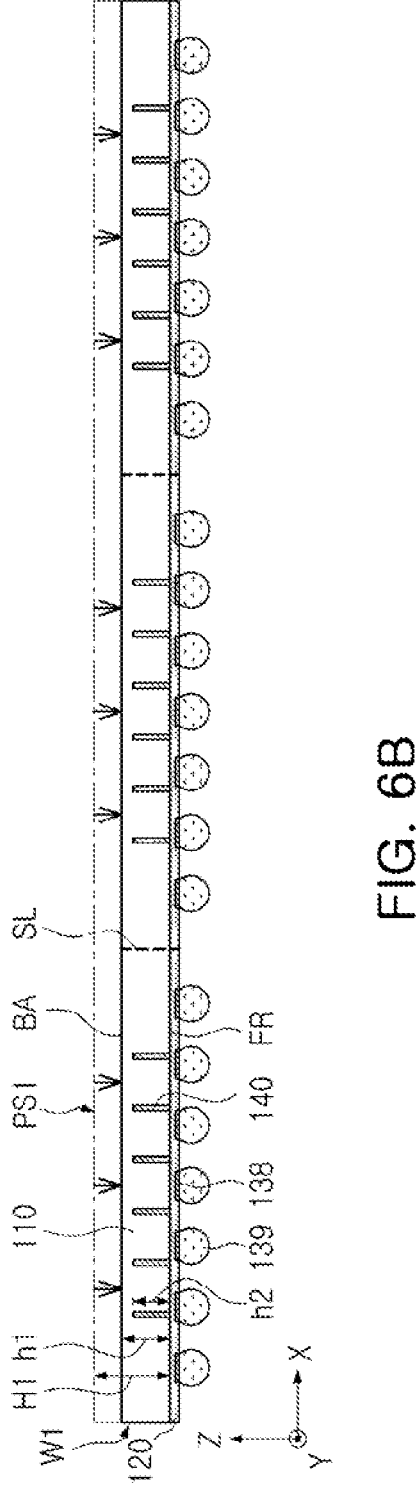

Referring to FIG. 6B, a polishing process may be applied to an upper surface PS1 of the preliminary semiconductor wafer W1' to form a semiconductor wafer W1 having a rear surface BA positioned opposite to the front surface FR.

A semiconductor wafer W1 having a reduced thickness may be formed by partially removing an upper portion of the preliminary semiconductor wafer W1' by the polishing process. For example, a thickness h1 of the substrate 110 after the polishing process may be greater than a thickness H1 of the preliminary substrate 110'. However, the substrate 110 may have a thickness h1 in which a plurality of through electrodes 140 are not exposed to the rear surface BA formed by the polishing process. For example, a height or thickness h1 between the rear surface BA and the front surface FR of the substrate 110 may be greater than a height or thickness h2 of the plurality of through electrodes 140. As the polishing process, a chemical mechanical polishing (CMP) process, an etch-back process, or a combination thereof may be used.

As described above, since a plurality of through electrodes 140 are not exposed in a process of partially removing the upper surface PS1 of the preliminary semiconductor wafer W1', the plurality of through electrodes 140 may be formed to have a relatively low height, compared with a manufacturing process of exposing the plurality of through electrodes 140 and planarizing the same. Accordingly, according to the method of manufacturing a semiconductor chip according to an example embodiment, an aspect ratio of the plurality of through electrodes 140 may be reduced, and the manufacturing process may be simplified.

Figure 6C:
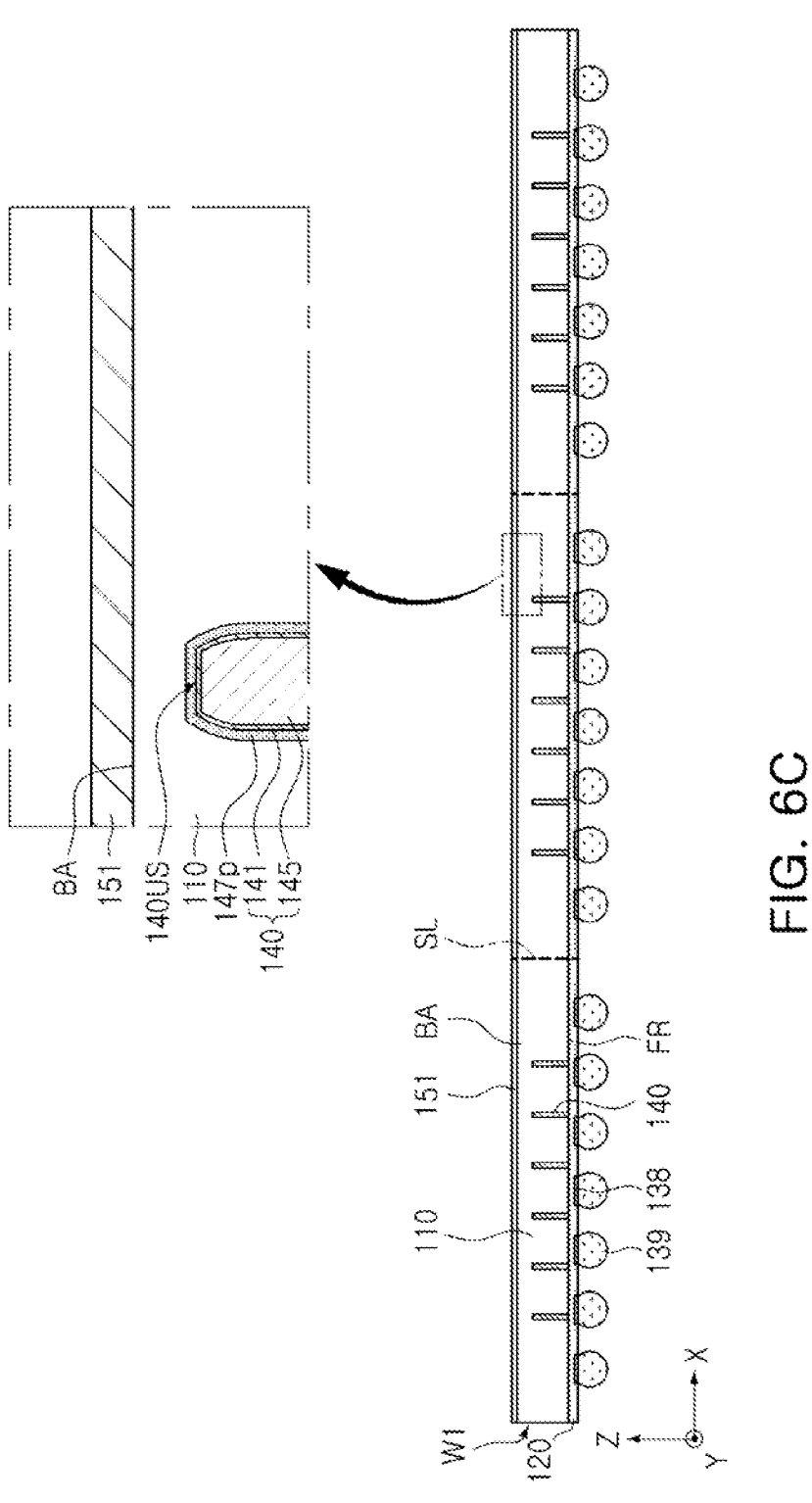

Referring to FIG. 6C, an insulating layer 151 may be formed on the semiconductor wafer W1 on the rear surface BA of the substrate 110.

The insulating layer 151 may include, for example, silicon carbonitride (SiCN), and may be formed using a PVD or CVD process. The insulating layer 151 may be spaced apart from an upper surfaces 140US of the plurality of through electrodes 140 by a predetermined distance. In addition, the upper surfaces 140US of the through electrodes 140 may be covered by a preliminary side insulating film 147p. The preliminary side insulating film 147p may include, for example, a HARP oxide layer.

Figure 6D:
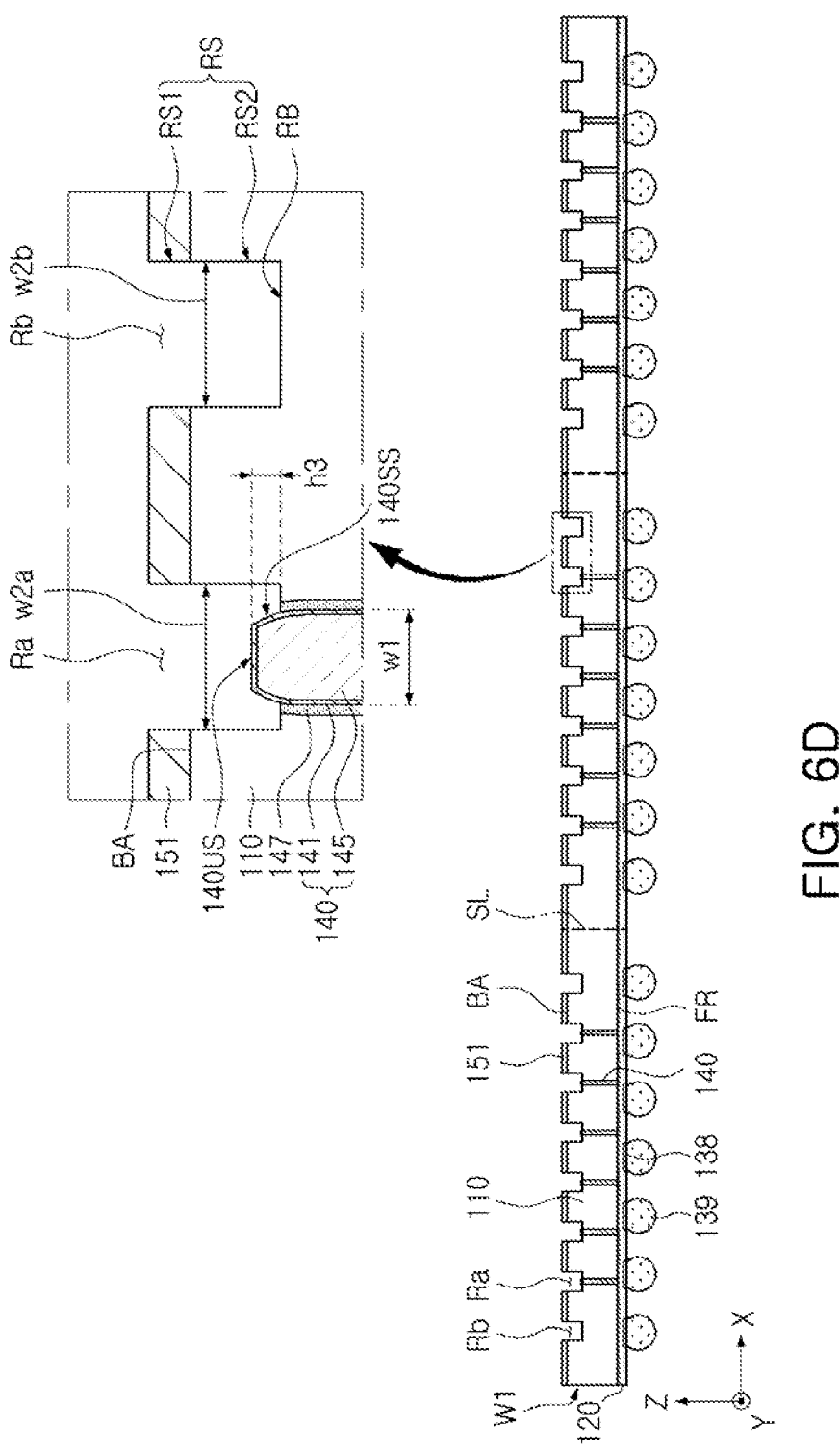

Referring to FIG. 6D, a portion of the insulating layer 151 and a semiconductor wafer W1 (or a substrate 110) may be etched to form a plurality of recess portions Ra and Rb penetrating through the insulating layer 151 and extending into the semiconductor wafer W1.

A plurality of recess portions Ra and Rb may be formed by removing a portion of the insulating layer 151 and the semiconductor wafer W1 in an etching process. The etching process may be, for example, a reactive-ion etching (RIE) process using a photoresist.

Each of the plurality of recess portions Ra and Rb may have a bottom surface RB provided by (e.g., defined by) the substrate 110, and an inner side surface RS provided by (e.g., defined by) the insulating layer 151 and the substrate 110. The plurality of recessed portions Ra and Rb may be formed to have a depth in which upper ends of the plurality of through electrodes 140 protrude from the bottom surface RB of the corresponding first recess portions Ra, respectively. Accordingly, the through electrode 140 corresponding to the first recess portions Ra may have an upper surface 140US and a side surface 140SS protruding from the bottom surface RB of the first recess portions Ra. Also, as a portion of the preliminary side insulating film 147p is removed by an etching process, the upper surface 140US and the side surface 140SS of the through electrodes 140 may be exposed from the side insulating film 147. For example, a height h3 of the through electrode 140 exposed from the bottom surface RB of the first recess portions Ra may be in a range of about 1 μm to about 5 μm. In some example embodiments, only the upper surface 140US of the through electrode 140 may be exposed to the bottom surface RB of the first recess portions Ra, and the side surface 140SS thereof may not be exposed.

The plurality of recess portions Ra and Rb may be formed to have widths w2a and w2b, greater than the width w1 of the plurality of through electrodes 140. For example, the width w1 of the plurality of through electrodes 140 may be in a range of about 5 μm to about 6 μm. The width w2a of the first recess portion Ra may be substantially the same as the width w2b of the second recess portion Rb, but may be different from each other according to example embodiments. The second recess portion Rb may be used as an alignment mark for designating an etched region in an etching process of FIG. 6F to be described later. Accordingly, as illustrated in FIG. 4C, a planar shape of the second recess portion Rb may be different from the planar shape of the first recess portion Ra.

Figure 6E:
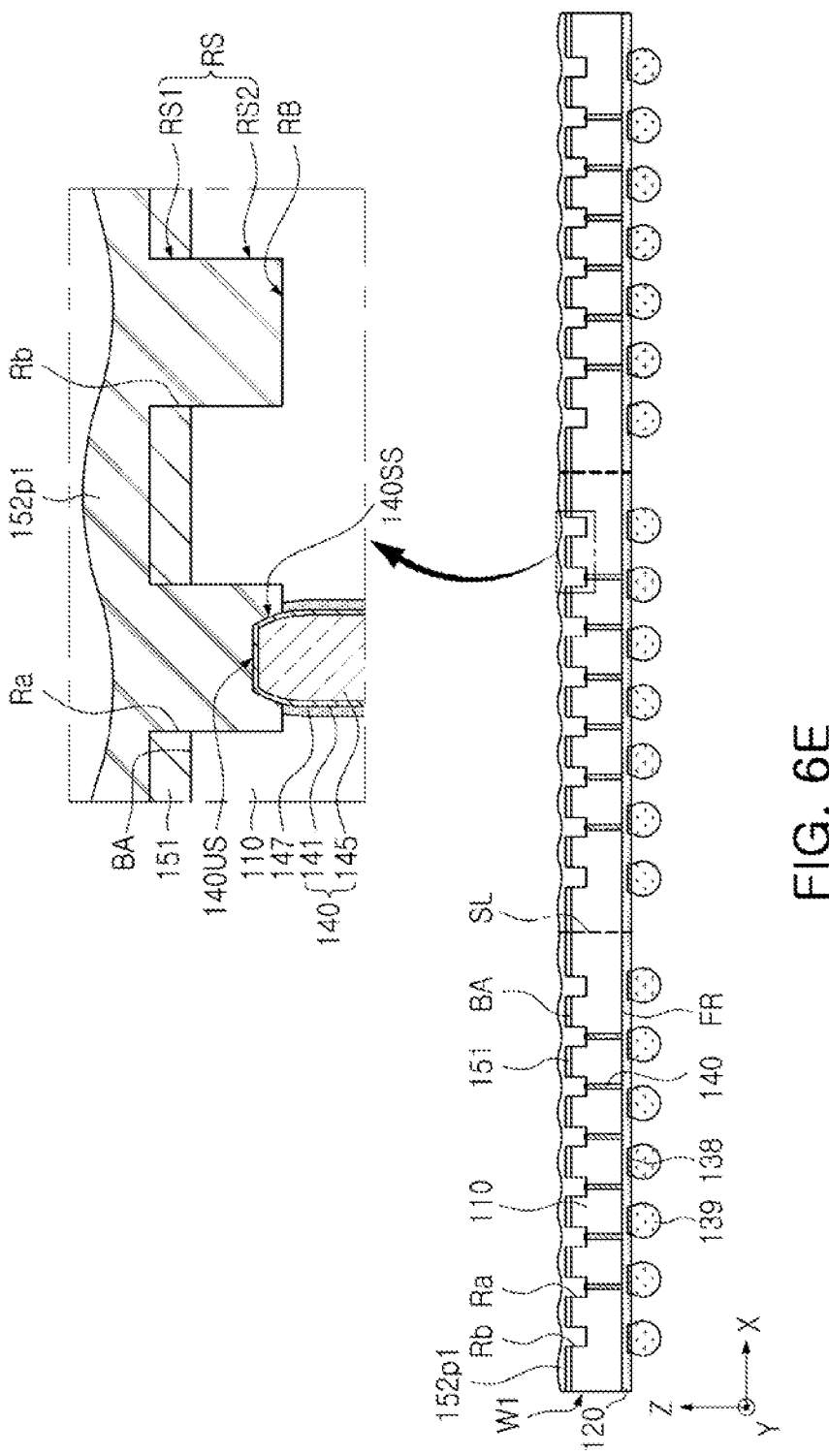

Referring to FIG. 6E, a first preliminary protective insulating layer 152p1 may be formed to fill a plurality of recessed portions Ra and Rb.

The first preliminary protective insulating layer 152p1 may include, for example, silicon oxide (SiO), and may include an HDP oxide layer. The first preliminary protective insulating layer 152p1 may be formed to cover an upper surface of the insulating layer 151, and fill an inside of the plurality of recess portions Ra and Rb. Accordingly, the first preliminary protective insulating layer 152p1 may be in contact with an inner side surface RS and a bottom surface RB of each of the plurality of recess portions Ra and Rb.

Figure 6F:
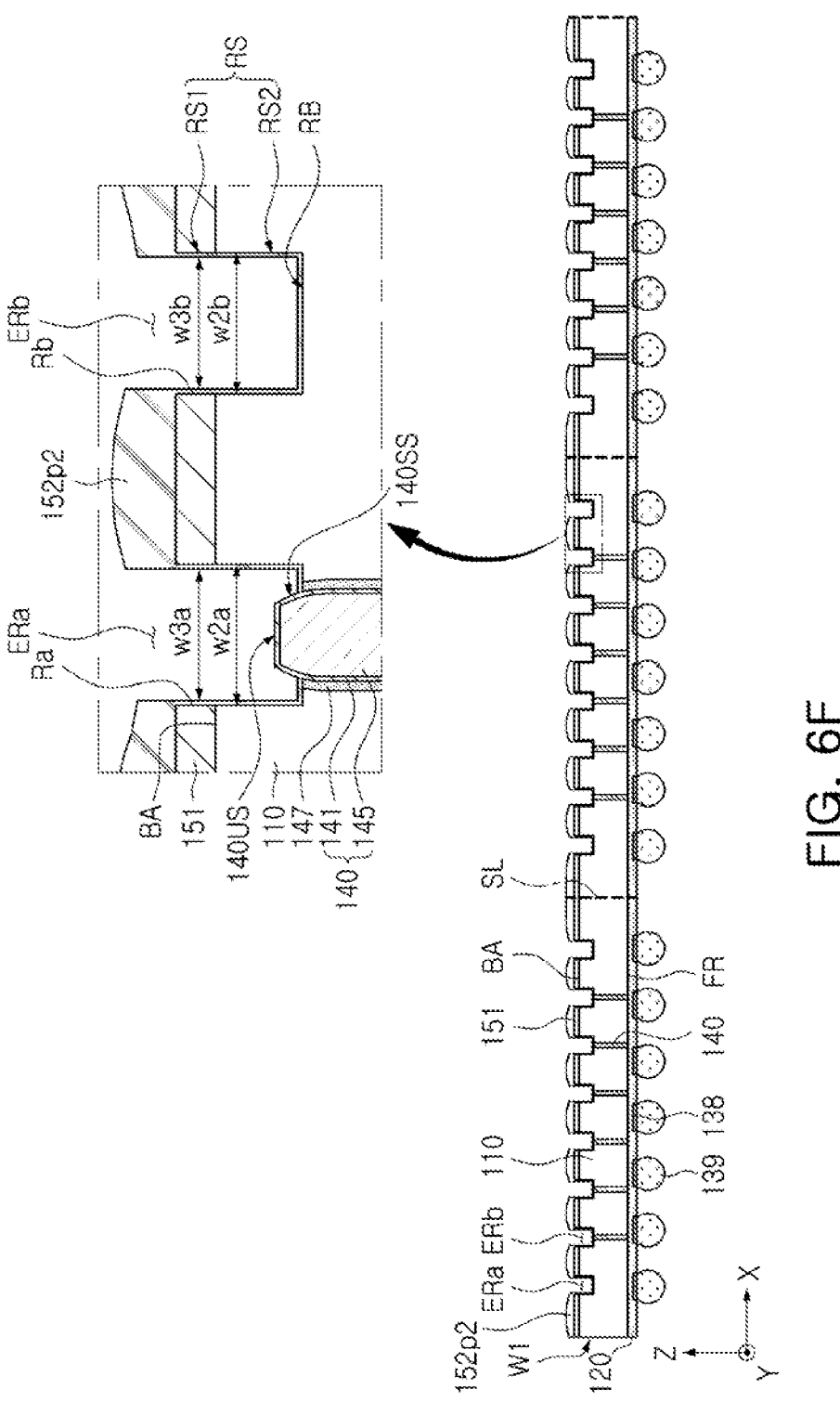

Referring to FIG. 6F, a portion of the first preliminary protective insulating layer 152p1 may be etched to form a second preliminary protective insulating layer 152p2 extending along an inner side surface RS and a bottom surface RB of each of the plurality of recess portions Ra and Rb.

A portion of the first preliminary protective insulating layer 152p1 may be removed by an etching process to form a plurality of etched regions ERa and ERb. The etching process may be, for example, a RIE process using a photoresist. The etching process may be performed using the second recess portion Rb as an alignment mark.

In the plurality of etched regions ERa and ERb, at least a portion of a second preliminary protective insulating layer 152p2 may be formed to conformally extend along the inner side surface RS and the bottom surface RB of each of the plurality of recessed portions Ra and Rb. For example, a width w3a of the first etched region ERa may be smaller than the width w2a of the first recess portion Ra, and a width w3b of the second etched region ERb may be smaller than the width w2b of the second recess portion Rb. Accordingly, at least a portion of the side surface 140SS of the through electrode 140 exposed from the side insulating film 147 may contact the second preliminary protective insulating layer 152p2.

Figure 6G:
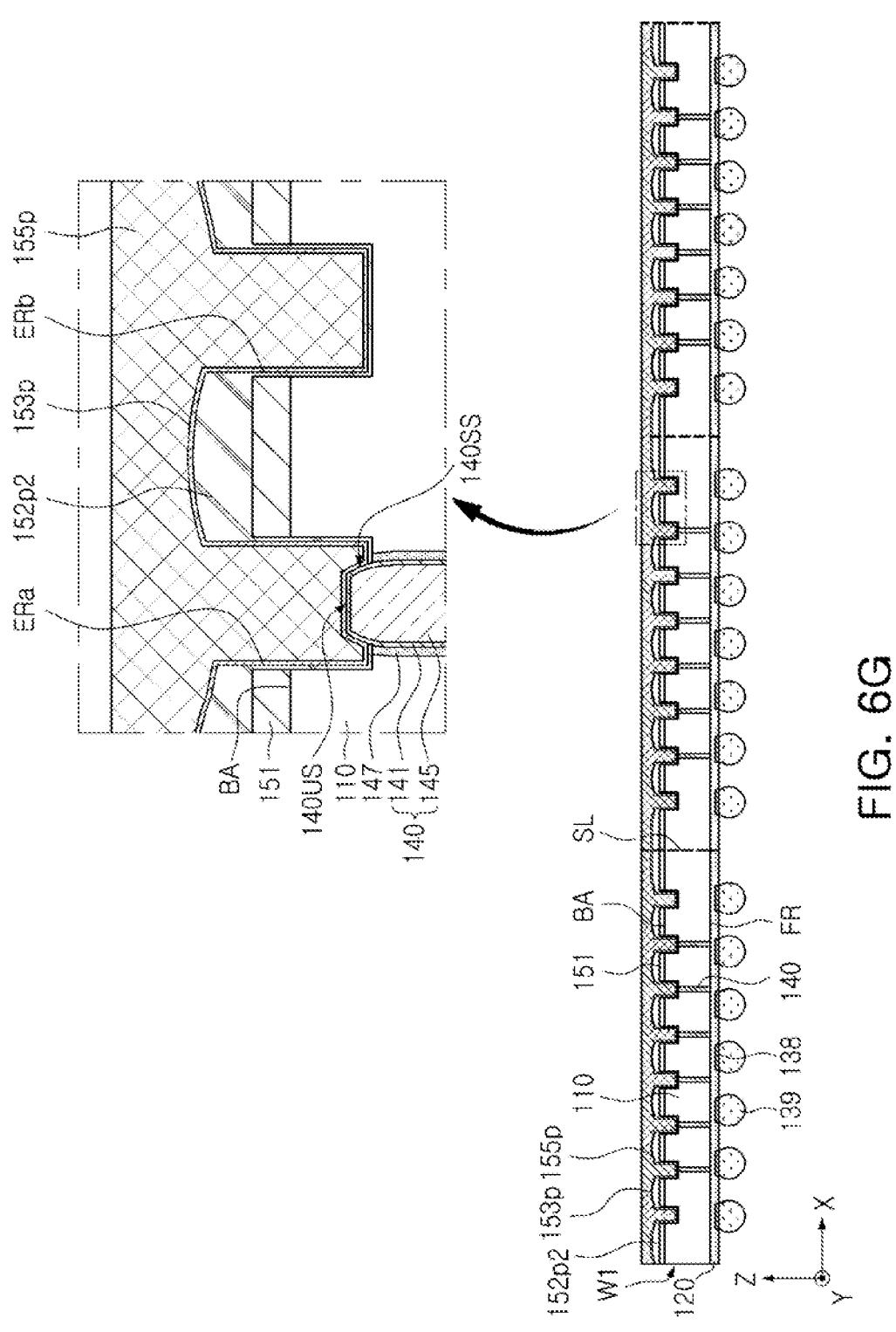

Referring to FIG. 6G, a preliminary barrier layer 153p and a preliminary plating layer 155p may be formed in the etched regions ERa and ERb of the second preliminary protective insulating layer 152p2.

The preliminary barrier layer 153p may be conformally formed along a surface of the second preliminary protective insulating layer 152p2. The preliminary plating layer 155p may be formed on the preliminary barrier layer 153p, and may fill an inside of the plurality of etched regions ERa and ERb. The preliminary barrier layer 153p and the preliminary plating layer 155p may be formed using a plating process, a PVD process, or a CVD process. For example, the preliminary barrier layer 153p may include titanium (Ti) or titanium nitride (TiN), and the preliminary plating layer 155p may include copper (Cu). A seed layer including the same material as the preliminary plating layer 155p may be disposed between the preliminary barrier layer 153p and the preliminary plating layer 155.

Figure 6H:
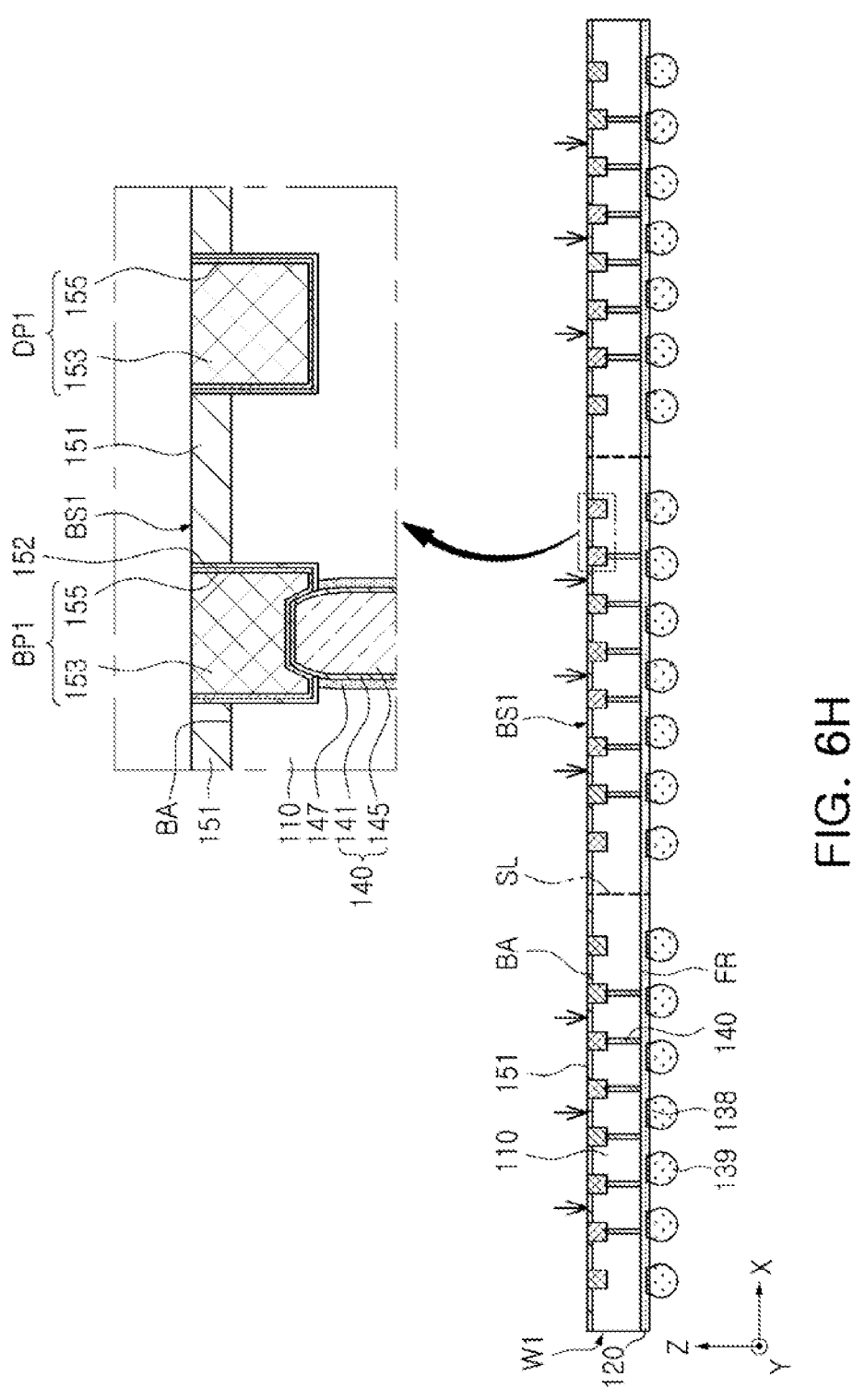

Referring to FIG. 6H, the preliminary plating layer 155p, the preliminary barrier layer 153p, and the second preliminary protective insulating layer 152p2 may be polished to form plating layers 155, barrier layers 153, and protective insulating layers 152.

A portion of the preliminary plating layer 155p, the preliminary barrier layer 153p, and the second preliminary protective insulating layer 152p2 may be removed by a polishing process, and connection pads BP1 and dummy pads DP1 including the plating layer 155 and the barrier layer 153 may be formed, respectively. In addition, protective insulating layers 152 surrounding side surfaces and lower surfaces of the connection pad BP1 and the dummy pad DP1 may be formed. Accordingly, the insulating layer 151, the plating layer 155, the barrier layer 153, and the protective insulating layer 152 may be substantially coplanar. The polishing process may be performed using, for example, a CMP process. For example, the semiconductor wafer W1 may have a flat upper surface BS1 provided by the insulating layer 151, the plating layer 155, the barrier layer 153, and the protective insulating layer 152.

Figure 7A:
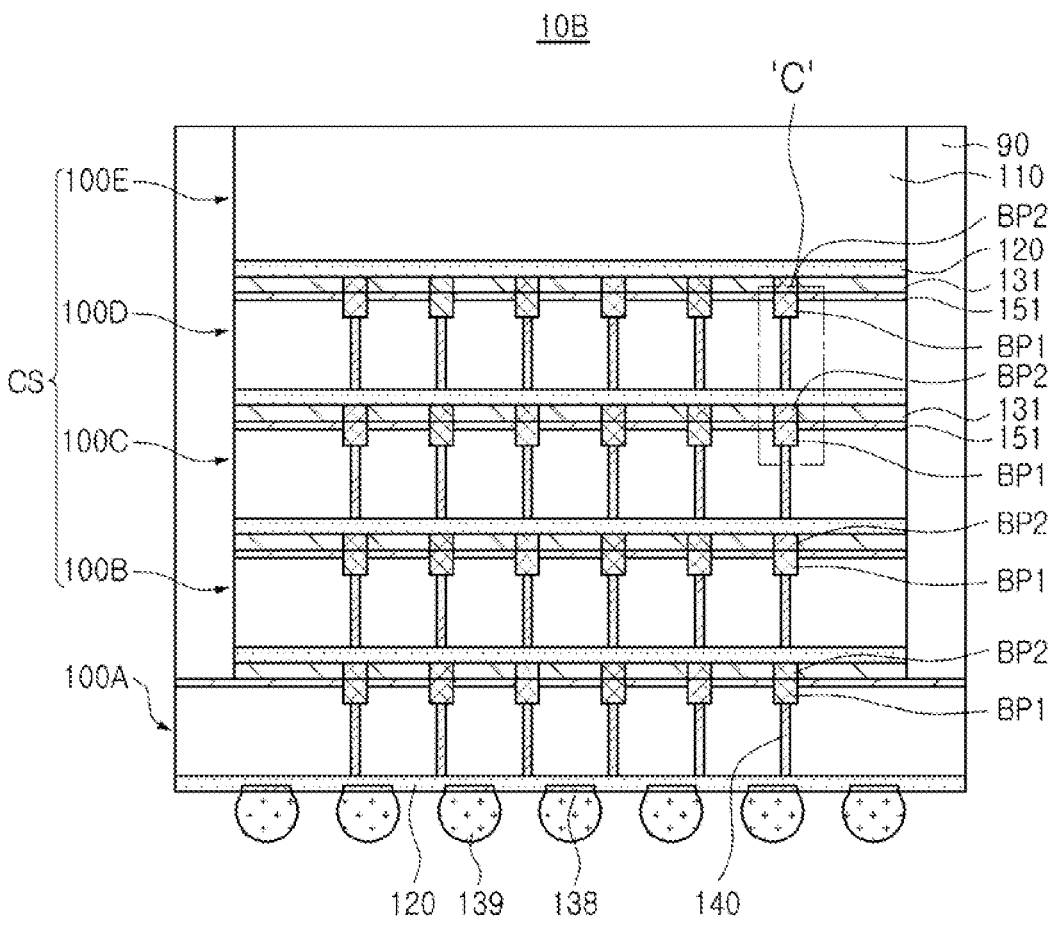
FIG. 7A is a cross-sectional view illustrating a semiconductor package according to an example embodiment.
Figure 7B:
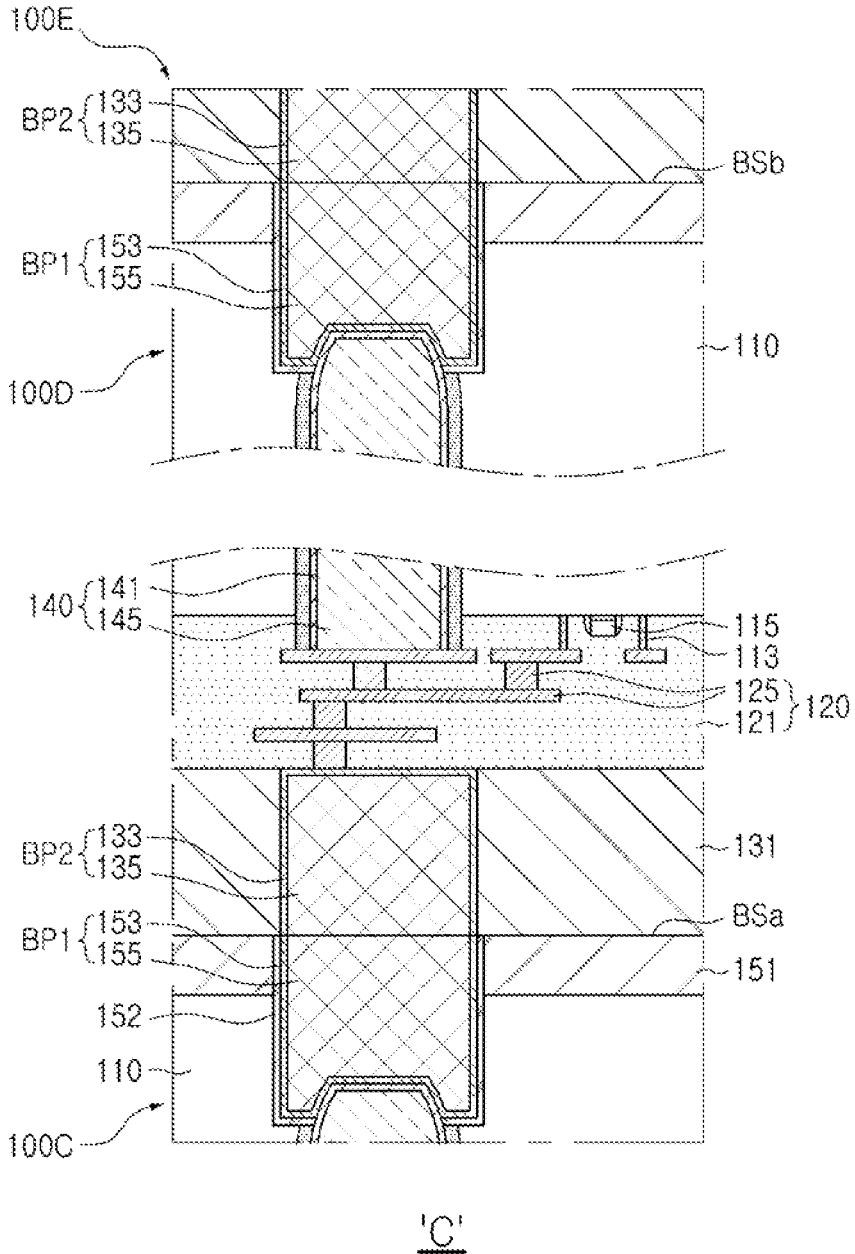
FIG. 7B is a partially enlarged view illustrating region 'C' of FIG. 7A.

FIG. 7A is a cross-sectional view illustrating a semiconductor package 10B according to an example embodiment of the disclosure, and FIG. 7B is a partially enlarged view illustrating region 'C' of FIG. 7A.

Referring to FIGS. 7A and 7B, the semiconductor package 10B according to an example embodiment may have the same or similar characteristics as those described with reference to FIGS. 1A to 5, except for including a chip structure CS and a molding member 90 disposed on the first semiconductor chip 100A, so overlapping description thereof will be omitted.

The chip structure CS may include a plurality of directly bonded semiconductor chips, for example, a second semiconductor chip 100B, a third semiconductor chip 100C, a fourth semiconductor chip 100D, and a fifth semiconductor chip 100E. A bonding surface to which the first insulating layer 151 and the second insulating layer 131, and the first bonding pad BP1 and the second bonding pad BP2 are bonded may be formed between each of the first to fifth semiconductor chips 100A, 100B, 100C, 100D, and 100E. For example, as illustrated in FIG. 7B, a first bonding surface BSa and a second bonding surface BSb may be formed between the third semiconductor chip 100C and the fourth semiconductor chip 100D and between the fourth semiconductor chip 100D and the fifth semiconductor chip 100E, respectively. According to an example embodiment, the chip structure CS may include more or fewer semiconductor chips than illustrated in the drawings. For example, the chip structure CS may include three or fewer or five or more semiconductor chips.

For example, the first semiconductor chips 100A may be a buffer chip or a control chip including a plurality of logic devices and/or memory devices. The first semiconductor chips 100A may transmit a signal from the second to fifth semiconductor chips 100B, 100C, 100D, and 100E stacked thereabove externally, and also transmit a signal and power from the outside to the second to fifth semiconductor chips 100B, 100C, 100D, and 100E. The second to fifth semiconductor chips 100B, 100C, 100D, and 100E may include memory chips including volatile memory devices such as DRAM and SRAM, or non-volatile memory devices such as PRAM, MRAM, FeRAM, or RRAM. In this case, the semiconductor package 10B of an example embodiment may be used for a high bandwidth memory (HBM) product, an electro data processing (EDP) product, or the like.

The first to fifth semiconductor chips 100A, 100B, 100C, 100D, and 100E may have the same or similar structure to the first semiconductor chip 100A described with reference to FIGS. 1A to 5, except for further including a through electrode 140 for forming a mutual electrical connection path. However, the fifth semiconductor chip 100E disposed at the top may not include the through electrode 140, and may have a relatively large thickness.

The molding member 90 may be disposed on the first semiconductor chip 100A, and may seal at least a portion of each of the second to fifth semiconductor chips 100B, 100C, 100D, and 100E. The molding member 90 may be formed to expose an upper surface of the fifth semiconductor chip 100E disposed on the uppermost portion. However, according to an example embodiment, the molding member 90 may be formed to cover the upper surface of the fifth semiconductor chip 100E. The molding member 90 may include, for example, an epoxy mold compound (EMC), but a material of the molding member 90 is not particularly limited.

Figure 8:
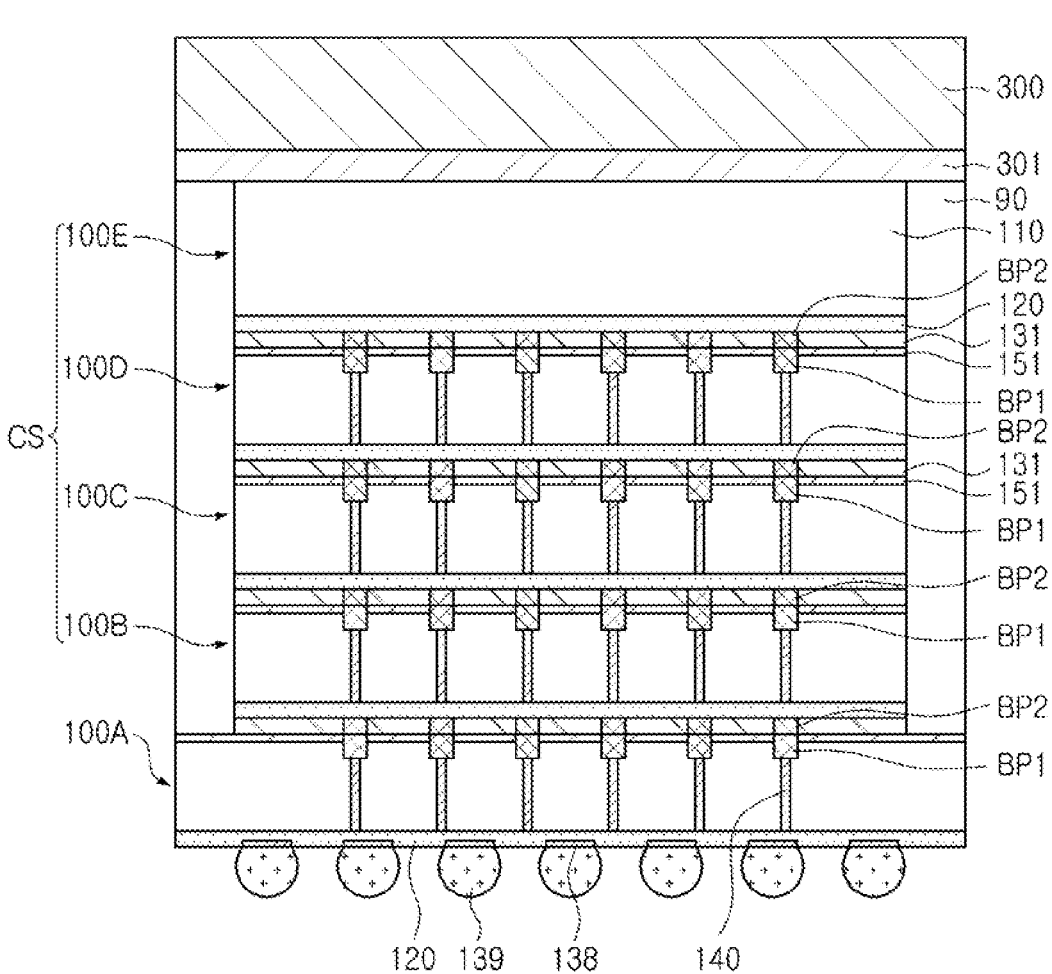
FIG. 8 is a cross-sectional view illustrating a semiconductor package according to an example embodiment.

FIG. 8 is a cross-sectional view illustrating a semiconductor package 10C according to an example embodiment.

Referring to FIG. 8, a semiconductor package 10C of an example embodiment may have the same or similar characteristics as those described with reference to FIGS. 7A to 7B, except for further including a heat dissipation structure 300 disposed on a chip structure CS. The heat dissipation structure 300 may be disposed on an uppermost semiconductor chip 100E and a molding member 90, and for example, may contact an upper surface of the uppermost semiconductor chip 100E exposed from the molding member 90. The heat dissipation structure 300 may include a material having excellent thermal conductivity, for example, aluminum (Al), gold (Au), silver (Ag), copper (Cu), iron (Fe), graphite, and the like. The heat dissipation structure 300 may be attached to the uppermost semiconductor chip 100E and the molding member 90 by an adhesive layer 301. The adhesive layer 301 may include, for example, a thermally conductive adhesive tape, thermally conductive grease, thermally conductive adhesive, and the like.

Figure 9:
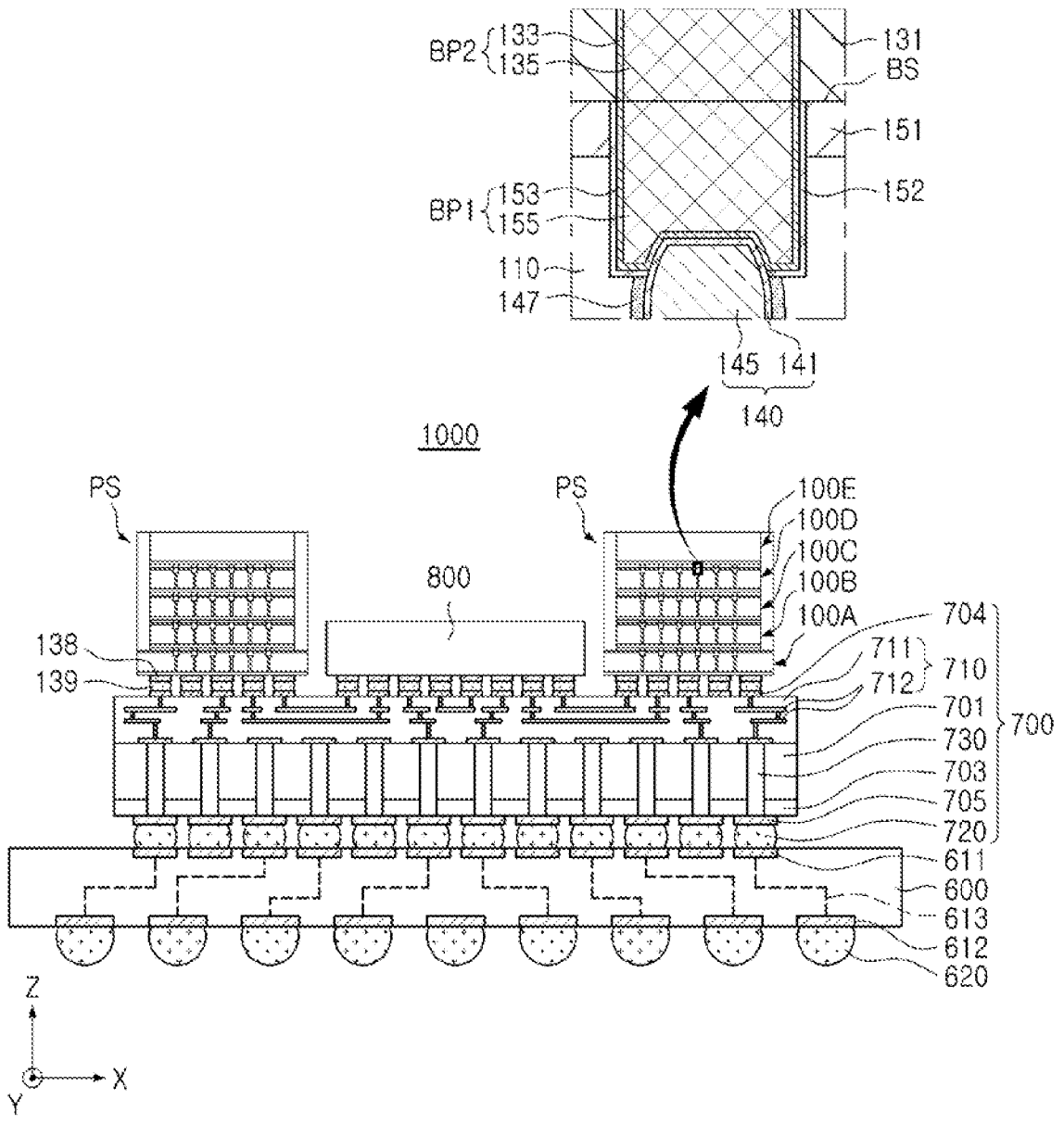
FIG. 9 is a cross-sectional view illustrating a semiconductor package according to an example embodiment.

FIG. 9 is a cross-sectional view illustrating a semiconductor package 1000 according to an example embodiment.

Referring to FIG. 9, a semiconductor package 1000 of an example embodiment may include a package substrate 600, an interposer substrate 700, and at least one package structure PS. In addition, the semiconductor package 1000 may further include a logic chip or a processor chip 800 disposed adjacently to the package structure PS on the interposer substrate 700. The package structure PS may have the same or similar characteristics to any one or more of the semiconductor packages 10, 10a, 10b, 10A, 10Aa, 10B, and 10C described with reference to FIGS. 1A to 8.

The package substrate 600 may be a support substrate on which an interposer substrate 700, a logic chip 800, and a package structure PS are mounted, and may be a substrate for a semiconductor package including a printed circuit board (PCB), a ceramic substrate, a glass substrate, a tape interconnection board, and the like. The package substrate 600 may include a lower pad 612 disposed on a lower surface of a body, an upper pad 611 disposed on an upper surface of the body, and an interconnection circuit 613 for electrically connecting the lower pad 612 and the upper pad 611. The body of the package substrate 600 may include different materials depending on the type of the substrate. For example, when the package substrate 600 is a printed circuit board, it may be in a form in which an interconnection layer is additionally laminated on one side or both sides of a body copper clad laminate or a copper clad laminate. The lower and upper pads 612 and 611 and the redistribution circuit 613 may form an electrical path connecting the lower surface and the upper surface of the package substrate 600. A connection bump 620 connected to the lower pad 612 may be disposed on a lower surface of the package substrate 600. The external connection bump 620 may include, for example, a solder ball.

The interposer substrate 700 may include a substrate 701, a lower protective layer 703, a lower pad 705, an interconnection structure 710, a conductive bump 720, and a through via 730. The package structure PS and the processor chip 800 may be stacked on the package substrate 600 via the interposer substrate 700. The interposer substrate 700 may electrically connect the package structure PS and the processor chip 800 to each other.

The substrate 701 may be formed of, for example, any one of silicon, an organic material, plastic, and a glass substrate. When the substrate 701 is a silicon substrate, the interposer substrate 700 may be referred to as a silicon interposer. When the substrate 701 is an organic substrate, the interposer substrate 700 may be referred to as a panel interposer.

A lower protective layer 703 may be disposed on a lower surface of the substrate 701, and a lower pad 705 may be disposed on the lower protective layer 703. The lower pad 705 may be connected to the through via 730. The package structure PS and the processor chip 800 may be electrically connected to the package substrate 600 through the conductive bumps 720 disposed on the lower pad 705.

The interconnection structure 710 may be disposed on an upper surface of the substrate 701, and may include an interlayer insulating layer 711 and a single-layer or multi-layer interconnection structure 712. When the interconnection structure 710 has a multilayer interconnection structure, interconnection patterns of different layers may be connected to each other through contact vias. An upper pad 704 connected to the interconnection structure 712 may be disposed on the interconnection structure 710. The package structure PS and the processor chip 800 may be connected to the upper pad 704 through the connection bump 139.

The through via 730 may extend from an upper surface to a lower surface of the substrate 701 to penetrate through the substrate 701. In addition, the through via 730 may extend into the interconnection structure 710 to be electrically connected to interconnections of the interconnection structure 710. When the substrate 701 is silicon, the through via 730 may be referred to as a through-silicon via (TSV). According to an example embodiment, the interposer substrate 700 may include only an interconnection structure therein, but may not include a through via.

The interposer substrate 700 may be used for the purpose of converting or transferring an input electrical signal between the package substrate 600 and a package structure PS or the processor chip 800. Accordingly, the interposer substrate 700 may not include elements such as active elements or passive elements. According to an example embodiment, the interconnection structure 710 may be disposed below a through via 730.

The conductive bump 720 may be disposed on a lower surface of the interposer substrate 700 and may be electrically connected to an interconnection of the interconnection structure 710. The interposer substrate 700 may be stacked on the package substrate 600 through a conductive bump 720. The conductive bump 720 may be connected to a lower pad 705 through interconnections of the interconnection structure 710 and the through via 730. In one example, a portion of lower pads 705 used for power or ground among the lower pads 705 may be integrated and connected together to the conductive bump 720, so that the number of the lower pads 705 may be greater than the number of the conductive bump 720.

The logic chip or processor chip 800 may include, for example, a central processor (CPU), a graphics processor (GPU), a field programmable gate array (FPGA), a digital signal processor (DSP), a cryptographic processor, a microprocessor, a microcontroller, an analog-to-digital converter, an application specific integrated circuit (ASIC), and the like. Depending on the types of devices included in the logic chip 800, the semiconductor package 1000 may be referred to as a server-oriented semiconductor package or a mobile-oriented semiconductor package.

As set forth above, according to example embodiments of the disclosure, by forming a recess portion for exposing a through electrode using an etching process, a semiconductor chip having a simplified process and improved yield and a manufacturing method thereof may be provided.

In addition, according to example embodiments of the disclosure, a semiconductor package having improved reliability may be provided by implementing a stack of semiconductor chips having an excellent quality bonding interface.

Herein, a lower side, a lower portion, a lower surface, and the like, are used to refer to a direction toward a mounting surface of the fan-out semiconductor package in relation to cross-sections of the drawings, while an upper side, an upper portion, an upper surface, and the like, are used to refer to a direction opposite to the direction. However, these directions are defined for convenience of explanation, and the claims are not limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second," the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the disclosure as defined by the appended claims.

What is claimed is:

1. A semiconductor package comprising:
a first semiconductor chip comprising:
    a first substrate comprising a front surface and a rear surface facing each other;
    a first insulating layer disposed on the rear surface of the first substrate;
    a recess portion extending into the first substrate through the first insulating layer;
    a protective insulating layer extending along an inner side surface of the recess portion and a bottom surface of the recess portion;
    a through electrode extending from the front surface to penetrate through the bottom surface of the recess portion and the protective insulating layer; and
    a first connection pad extending from the rear surface and having a lower surface contacting an upper surface of the through electrode between the front surface and the rear surface of the first substrate, the first connection pad being surrounded by the protective insulating layer, the first semiconductor chip comprising a flat upper surface defined by each of an upper surface of the first insulating layer, an upper surface of the protective insulating layer, and an upper surface of the first connection pad; and
a second semiconductor chip disposed on the upper surface of the first semiconductor chip, the second semiconductor chip comprising:
    a second substrate;
    a second insulating layer disposed below the second substrate and contacting the upper surface of the first insulating layer; and
    a second connection pad disposed in the second insulating layer and contacting the upper surface of the first connection pad.

2. The semiconductor package of claim 1, wherein the first connection pad comprises a first plating layer filling an inside of the recess portion, and a first barrier layer surrounding an outer edge of the first plating layer, and
wherein the upper surface of the first connection pad is defined by an upper surface of the first plating layer and an upper surface of the first barrier layer.

3. The semiconductor package of claim 2, wherein the first plating layer comprises at least one of copper (Cu), nickel (Ni), gold (Au), and silver (Ag), and
wherein the first barrier layer comprises at least one of titanium (Ti), titanium nitride (TiN), tantalum (Ta), and tantalum nitride (TaN).

4. The semiconductor package of claim 1, wherein the through electrode comprises a plurality of side surfaces exposed from the protective insulating layer, and
wherein the upper surface of the through electrode is exposed from the protective insulating layer.

5. The semiconductor package of claim 4, wherein the first connection pad directly contacts the upper surface and the plurality of side surfaces of the through electrode.

6. The semiconductor package of claim 5, wherein the first connection pad comprises:

a first barrier layer contacting the upper surface and the plurality of side surfaces of the through electrode exposed from the protective insulating layer; and a first plating layer disposed on the first barrier layer.

7. The semiconductor package of claim 1, wherein the first semiconductor chip further comprises a side insulating film extending from the front surface of the first substrate along a side surface of the through electrode.

8. The semiconductor package of claim 7, wherein at least a portion of the bottom surface of the recess portion is defined by an upper surface of the side insulating film.

9. The semiconductor package of claim 7, wherein the side insulating film comprises at least one of silicon oxide and silicon nitride.

10. The semiconductor package of claim 1, wherein a thickness of the first insulating layer is greater than a thickness of the protective insulating layer.

11. The semiconductor package of claim 1, wherein the second semiconductor chip comprises a flat lower surface defined by a lower surface of the second insulating layer, and a lower surface of the second connection pad, and wherein the lower surface of the second semiconductor chip contacts the upper surface of the first semiconductor chip.

12. A semiconductor package comprising:

a first semiconductor chip comprising:

a first substrate comprising a front surface and a rear surface facing each other;

a first insulating layer disposed on an upper surface of the first substrate;

a recess portion extending into the first substrate through the first insulating layer;

a protective insulating layer covering an inner side surface of the recess portion and a bottom surface of the recess portion;

a through electrode protruding farther than the bottom surface of the recess portion through at least a portion of the first substrate; and a first connection pad disposed in the recess portion, extending from the rear surface and having a lower surface contacting an upper surface of the through electrode between the front surface and the rear surface of the first substrate, the first connection pad being surrounded by the protective insulating layer; and a second semiconductor chip disposed on the first semiconductor chip, the second semiconductor chip comprising:

a second insulating layer contacting the first insulating layer, and a second connection pad disposed in the second insulating layer and contacting the first connection pad, wherein a thickness of the first insulating layer in a direction perpendicular to the upper surface of the first substrate is greater than a thickness of the protective insulating layer in a direction perpendicular to the inner side surface of the recess portion or the bottom surface of the recess portion.

13. The semiconductor package of claim 12, wherein the inner side surface of the recess portion comprises a first region defined by the first insulating layer and a second region defined by the first substrate, and wherein a clear boundary exists between the protective insulating layer covering the first region and the first insulating layer contacting the protective insulating layer covering the first region.

14. The semiconductor package of claim 13, wherein the first insulating layer comprises silicon carbonitride (SiCN), and wherein the protective insulating layer comprises silicon oxide (SiO).

15. The semiconductor package of claim 12, wherein the thickness of the protective insulating layer is in a range from about 10 nm to about 50 nm, and wherein the thickness of the first insulating layer is in a range from about 100 nm to about 250 nm.

16. The semiconductor package of claim 12, wherein the first connection pad comprises a plating layer filling an inside of the recess portion, and an upper barrier layer surrounding an outer edge of the plating layer, wherein the through electrode comprises a via plug and a lower barrier layer surrounding an outer edge of the via plug, and wherein a clear boundary exists between the upper barrier layer and the lower barrier layer.

17. The semiconductor package of claim 16, wherein each of the upper barrier layer and the lower barrier layer comprises at least one of titanium (Ti), titanium nitride (TiN), tantalum (Ta), and tantalum nitride (TaN).

18. A semiconductor package comprising:

a first semiconductor chip comprising:

a first substrate;

a first insulating layer disposed on the first substrate;

a plurality of recess portions extending into the first substrate through the first insulating layer;

a plurality of protective insulating layers, each of the plurality of protective insulating layers covering an inner side surface and a bottom surface of a respective one of the plurality of recess portions; and a first connection pad and a first dummy pad respectively disposed in the plurality of recess portions, the first connection pad and the first dummy pad being surrounded by a respective one of the plurality of protective insulating layers, the first semiconductor chip comprising an upper surface defined by an upper surface of the first insulating layer, an upper surface of each of the plurality of protective insulating layers, an upper surface of the first connection pad, and an upper surface of the first dummy pad; and a second semiconductor chip disposed on the first semiconductor chip, the second semiconductor chip comprising:

a second insulating layer contacting the first insulating layer;

a second connection pad disposed in the second insulating layer and contacting the first connection pad; and a second dummy pad disposed in the second insulating layer and contacting the first dummy pad, wherein, on a plane parallel to the upper surface of the first semiconductor chip, a planar shape of the first dummy pad is different from a planar shape of the first connection pad.

19. The semiconductor package of claim 18, wherein, on the plane, each of the plurality of protective insulating layers surrounds a corresponding one of the first connection pad and the first dummy pad.

20. The semiconductor package of claim 18, wherein the first semiconductor chip further comprises a plurality of through electrodes, each of the plurality of through electrodes protruding from the bottom surface of the respective one of the plurality of recess portions through at least a portion of the first substrate, and wherein at least a portion of the plurality of through electrodes is connected to the first connection pad.

* * * * *